US005948575A

United States Patent [19]

Roosen

[11] Patent Number: 5,948,575

[45] **Date of Patent: *Sep. 7, 1999**

[54] PRODUCTION OF MATCHING COLOR PRINTS BY ESTABLISHING SUITABLE COLOR MASTER

[75] Inventor: Raymond Roosen, Gravenwezel, Belgium

[73] Assignee: Agfa-Gevaert, Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/634,408

[22] Filed: Apr. 18, 1996

[30] Foreign Application Priority Data

Apr. 24, 1995 [DE] Germany .............................. 95201036

[51] Int. Cl.[6] ........................................ G03F 9/00

[52] U.S. Cl. ................................ 430/7; 430/30; 430/357; 430/359

[58] Field of Search ................................ 430/7, 30, 357, 430/359

[56] References Cited

U.S. PATENT DOCUMENTS

| | | | |
|---|---|---|---|
| 3,709,686 | 1/1973 | Erdell | 430/7 |
| 4,987,043 | 1/1991 | Roosen et al. | 430/7 |
| 5,645,962 | 7/1997 | Vanmaele et al. | 430/7 |

*Primary Examiner*—Maria Nuzzolillo
*Assistant Examiner*—Laura Weiner
*Attorney, Agent, or Firm*—Baker & Botts, L.L.P.

[57] ABSTRACT

In a process for the manufacture of a multi-color filter array element, for use in color flat panel displays, a multi-layer color photographic material is exposed to printing light, modulated by a master. Instead of varying the conditions of the printing light in order to achieve specified calorimetric characteristics, the filter density of the pixels on the master is established such that a correct color print is obtained under fixed standard printing conditions. A method is disclosed for computing and achieving the required spectral densities on the color print and on the master.

18 Claims, 10 Drawing Sheets

PRODUCTION OF MATCHING COLOR PRINTS BY ESTABLISHING SUITABLE COLOR MASTER

DESCRIPTION

1. Field of the Invention

The present invention relates to a method for easily and accurately defining a set of exposures to be given to a multi-layer color photographic master material, suitable for use in the production of a multi-color filter array element from a multi-layer color photographic print material. The multi-color filter can be incorporated in a flat panel display, in order to obtain after processing of the print material a multi-color filter array element having predetermined calorimetric characteristics.

2. Background of the Invention

Flat panel display (FPD) devices are used nowadays in numerous applications such as clocks, household appliances, electronic calculators, audio equipment, etc. There is a growing tendency to replace cathode ray tubes by FPD devices being favored for their smaller volume and lower power consumption. One of the most promising FPD technologies is the liquid crystal display (LCD) technology.

Liquid crystal display devices generally include two spaced glass panels, which define a sealed cavity, that is filled with a liquid crystal material. The glass plates are covered with a transparent electrode layer which may be patterned in such a way that a mosaic of picture elements (pixels) is created.

Full color reproduction is made possible by the use of a color filter array element inside the liquid crystal display device, wherein that element contains red, green and blue patches in a given order. For contrast improvement, the color patches may be separated by a black contour line pattern, delineating the individual color pixels (ref. e.g. U.S. Pat. No. 4,987,043).

Several techniques for making color filter array elements have been described in the prior art.

A first widely used technique operates according to the principles of photolithography (ref. e.g. published EP-A 0 138 459) and is based on photo-hardening of polymers e.g. gelatin.

Dichromated gelatin, doped with a photosensitizer is coated on glass, exposed through a mask, developed to harden the gelatin in the exposed areas and washed to remove the unexposed gelatin. The remaining gelatin is dyed in one of the desired colors. A new gelatin layer is coated on the dyed relief image, exposed, developed, washed and dyed in the next color, and so on. By that wash-off and dying technique, four complete operation cycles are needed to obtain a red, green and blue color filter array having the color patches delineated with a black contour line. As an alternative, dyeable or colored photopolymers are used for producing superposed colored photoresists. In the repeated exposures, a great registration accuracy is required in order to obtain color filter patches matching the pixel-electrodes.

In a modified embodiment of said photoresist technique, organic dyes or pigments are applied by evaporation under reduced pressure (vacuum evaporation) to form a colored pattern in correspondence with photoresist openings [ref. Proceedings of the SID, vol. 25/4, p. 281–285, (1984)]. As an alternative, a mechanical precision stencil screen has been used for pattern-wise deposition by evaporation of dyes onto a selected substrate (ref. e.g. Japan Display 86, p. 320–322).

According to a second technique, dyes are electro-deposited on patterned transparent electrodes from a dispersion of curable binder polymers, dispersing agents and colored pigments. For each color, a separate deposition and curing step is needed.

According to a third technique, the red, green and blue dyes are deposited by thermal transfer from a dye donor element to a dye-receiving element, comprising a transparent support, e.g. glass plate, having thereon a dye-receiving layer. Image-wise heating is preferably done by means of a laser or a high intensity light flash. For each color, a separate dye transfer step must be carried out.

According to a fourth technique as described e.g. in U.S. Pat. No. 4,271,246 a method of producing a multi-color optical filter comprises the steps of:

(1) exposing a photographic material—comprising a support and a single, i.e. one, black-and-white silver halide emulsion layer—to light through a first pattern;

(2) developing the exposed emulsion layer with a first coupler-containing color developer to form a pattern of a first dye;

(3) exposing an unexposed portion of said emulsion layer to light through a second pattern;

(4) developing the exposed area with a second coupler-containing color developer to form a pattern of a second dye;

(5) repeating exposure and development to form patterns containing dyes of third and optionally subsequent colors, thereby to form color patterns of at least two colors; and (6) subjecting the product to a silver removal treatment after the final color development step.

All the above described techniques have in common that they require at least three treatment steps. At least four steps are required, if the black contour pattern requires a separate step. Some of these steps require very costly exposure apparatuses to reach the desired level of registration.

Due to the large number of production steps and the required accuracy, the manufacturing yields—i.e. the percentage of the color filter array elements made in the factory which meet quality control standards—are exceptionally low.

The very costly investments could be brought down if the filter production could be simplified and yet high quality maintained.

When using a multi-layer color photographic silver halide material for multi-color filter production, comparable to color print film used in the motion picture film industry, the above mentioned problems related to image-registration and the application of a large number of processing steps can be avoided. From one color negative, an unlimited number of color positives on film can be produced at a very high rate. Only one exposure for each positive is required. A great number of exposed positives can be chemically treated at the same time in the same machine. This makes the whole process very attractive from the viewpoint of yield and investment.

A multi-layer color photographic material, especially suitable for the fabrication of multi-color filter array elements for FPD's with high thermal stability and very good color rendering properties operating with a negative color image as original to form a complementary color pattern on a glass substrate is described in European Patent Application No. EP 0 615 161, titled: "A photographic print material suited for the production of a multi-color liquid crystal display."

It is common praxis that the negative-positive process, used for landscape or portrait photography, is adapted to obtain a subjectively better satisfying color reproduction. For example, it is usual to reproduce colors like e.g. skin colors, sky blue, and foliage green in a subjectively more pleasing manner.

Subjectively better satisfying color prints on paper and film can be produced at high rate and high yield, making use of processes and apparatus described by e.g. L. B. Happé in "Your Film and the Lab"—Focal Press London, and by R. U. G. Hunt in "The Reproduction of Colour"—Fountain Press-London.

The red, green and blue patches of a multi-color filter array element for use in a FPD must be produced in such a way that they meet some well defined objective criteria. As far as color rendition is concerned, those criteria are usually defined in calorimetric terms. This is uncommon in motion-picture and still color photography.

For a given application or field of applications, a color FPD manufacturer may specify objectively the R, G and B primaries of a color FPD he plans to produce.

He has to select carefully all the components that influence the color of the primaries. In the case of a color LCD, the main color influencing components are:

the light-source used for back lighting;

the front and rear polarizers; and the color filter array element.

Photographically formed color filter arrays—of the kind described in EP 0 396 824 A1 and in the already mentioned publication EP 0 615 161—contain yellow, magenta and cyan dyes in separate, superimposed layers. These applications describe the production of a color filter array or color print, comprising the following steps:

- providing a print material comprising a multi-layer color photographic silver halide material;
- exposing the print material to printing light through a negatively colored master, to obtain exposed print material;
- color developing the exposed print material to obtain the color print or multi-color filter array element.

By photographic exposure and subsequent color developing, separate superimposed print dye layers are formed in the color filter array.

The negative master may be produced by following steps:

- providing a master material comprising a multi-layer photographic color material;
- applying a different red, green and blue exposure through a black and white pixel mask to the master material, for each type of pixels (red, green and blue) required in the multi-color filter array element, to obtain exposed master material; and
- color developing the exposed master material for generating different amounts of master dye on the different pixel locations.

The amounts of print dyes, in the multi-color filter array element, needed to match the red (R), green (G) and blue (B) primaries, depend on the spectral characteristics of the dyes, but also on the spectrum of the light emitted by the back-light source, the front and rear polarizers and other spectrally active components of the LCD.

If, for some reason, during the manufacture of the color LCD, one or more spectrally active components are changed, the amounts of the print dyes in the photographically produced color filters must be adapted in order to keep the R, G and B primaries matched.

The amounts of the yellow, magenta and cyan print dyes in the multi-color filter array element are governed by the amounts of yellow, magenta and cyan master dyes in the negative master and by the printing conditions, i.e. the spectral composition and the intensity of the light beam or beams used to print the negative master on the positive print, and the duration of the exposure or exposures.

The amounts of yellow, magenta and cyan master dyes in the negative master in turn depend on the exposure conditions, i.e. the spectral composition and the intensity of the light-beams used to expose the negative multi-layer color photographic material through the black and white mask and the duration of the exposures.

The correct exposures, which have to be applied to the multi-color silver halide emulsion print material for obtaining a "positive" color print, resulting in correct amounts of yellow, magenta and cyan print dyes, to match—according to the principles of subtractive color photography—the selected primaries R, G and B, may possibly be found with trial and error by someone very well skilled in the art of exposing negative color materials with the aim of producing color negatives that can be reversed to correct color positives.

This experimental method is however very time-consuming and must be repeated each time the specifications of the R, G and B primaries are altered, or whenever a new batch of positive or negative material is used, or when the light-source for back-lighting, the front and rear polarizers or any other spectrally active component is changed.

OBJECTS OF THE INVENTION

It is an object of the invention to provide a method for establishing local amounts of dye in the print, with a minimum of experiments, in order to produce a print with specified print filter densities in a region of the print.

It is another object of the invention to achieve correct colors in the print material, without the need for masking techniques in the color couplers within the master or print material.

It is a further object of the invention to cope with secondary printing densities in the master dyes formed in the master material.

It is a specific object of the present invention to provide a method for determining quickly, with great accuracy and without special skills, the exposures to be applied to the master material in a process for manufacturing a color print, according to the following steps:

(1) successive monochrome exposures to blue, green and red light through one or more black and white masks to a negative-working color-developable multi-layer silver halide emulsion material, having differently spectrally sensitized layers with blue, green and red light sensitivity respectively, called negative material or "master material", to color develop therein a mosaic type color pattern ("master") containing predominantly yellow, magenta and cyan pixels, and (2) the single step additive or subtractive exposure to be given through the thus obtained color pattern ("master") to another negative-working multi-layer silver halide emulsion material ("print material") containing:

i a silver halide emulsion layer sensitive to blue light and containing a yellow dye forming color coupler;

ii a silver halide emulsion layer sensitive to green light and containing a magenta dye forming color coupler; and, iii a silver halide emulsion layer sensitive to red light and containing a cyan dye forming color coupler in order to obtain therein a mosaic type pattern containing blue, green and red pixels which produce, in combination with the selected back-light source, the front and rear polarizers and other spectrally active components of a multi-color liquid crystal display (LCD) a multi-color pattern of which the hue and saturation of the primary colors, red (R), green (G) and blue (B) correspond with or match selected values of x, y or u' or v' or LUV or LAB or some other form of calorimetric specification, given the spectral power distribution of said light-source.

It is a particular object of the present invention to automate the method with the aid of a software program that can run e.g. on a personal computer, and wherein a computer or microprocessor is used for monitoring the exposures to be given by suitable exposure apparatuses, such that a high degree of automation is realized.

Other objects and advantages of the present invention will become clear from the further description, drawings and examples.

SUMMARY OF THE INVENTION

The above mentioned objects are realised by the specific features according to claim 1. Preferred embodiments of the invention are disclosed in the dependent claims.

A monochrome region on the print may be one of the pixels on the multi-color filter for use in a flat panel display. Monochrome is different from monochromatic. Monochrome means that the whole region has substantially the same color. This color may be indicated by three filter density values, measured e.g. by a color densitometer.

In order to relate the back-light to the print for getting the required color match, the method according to the present invention makes use of the spectral transmittance of the yellow, magenta and cyan print dyes, generated in the positive material by "printing" exposure to light and subsequent chemical development. The "printing conditions" are computed in relation to the amounts of these print dyes that have to be formed in positive material or print.

A specific method, according to one embodiment of the current invention, comprises the following steps in consecutive order:

(1) From the spectral transmission characteristics of the print dyes (cyan, magenta and yellow) and the spectral composition of the light traversing the liquid crystal display, the amounts of the print dyes ($Q_C^P, Q_M^P, Q_Y^P$) needed to match a set of specified red, green and blue primaries are computed and expressed as filter densities measured on the print, further referred to as "print filter densities".

(2) The corresponding integral master densities of the negative master ($D_R^N, D_G^N, D_B^N$) are deduced from response curves of the print material (as discussed in conjunction with FIGS. 2–4) of the print material to selective exposures (red, green and blue light) through cyan, magenta and yellow master wedges.

(3) The correct amounts of cyan, magenta and yellow ($Q_C^N, Q_M^N, Q_Y^N$) to be generated in the negative master are computed from those integral master densities ($D_R^N, D_G^N, D_B^N$). In a more preferred embodiment, a fourth step is added:

(4) Taking into account the effect of secondary absorptions (or, more precisely: secondary printing densities) of the master dyes on the response of the print material, analytical master filter densities ($D_R^{CN}, D_G^{MN}, D_B^{YN}$) are computed from the integral master densities ($D_R^N$, $D_G^N, D_B^N$).

(5) The selective exposures to red (R), green (G) and blue (B) light ($E_{rR}, E_{rG}, E_{rB}$, $E_{gR}, E_{gG}, E_{gB}$, $E_{bR}, E_{bG}, E_{bB}$) needed to produce in the negative master the correct amounts of cyan, magenta and yellow—in order to achieve on the print red (r), green (g) and blue (b) pixels—are derived from the response data (as discussed in conjunction with FIGS. 6–8) of the master material to selective exposures (R, G, B) through a neutral wedge.

DETAILED DESCRIPTION OF THE INVENTION

Figure 1:
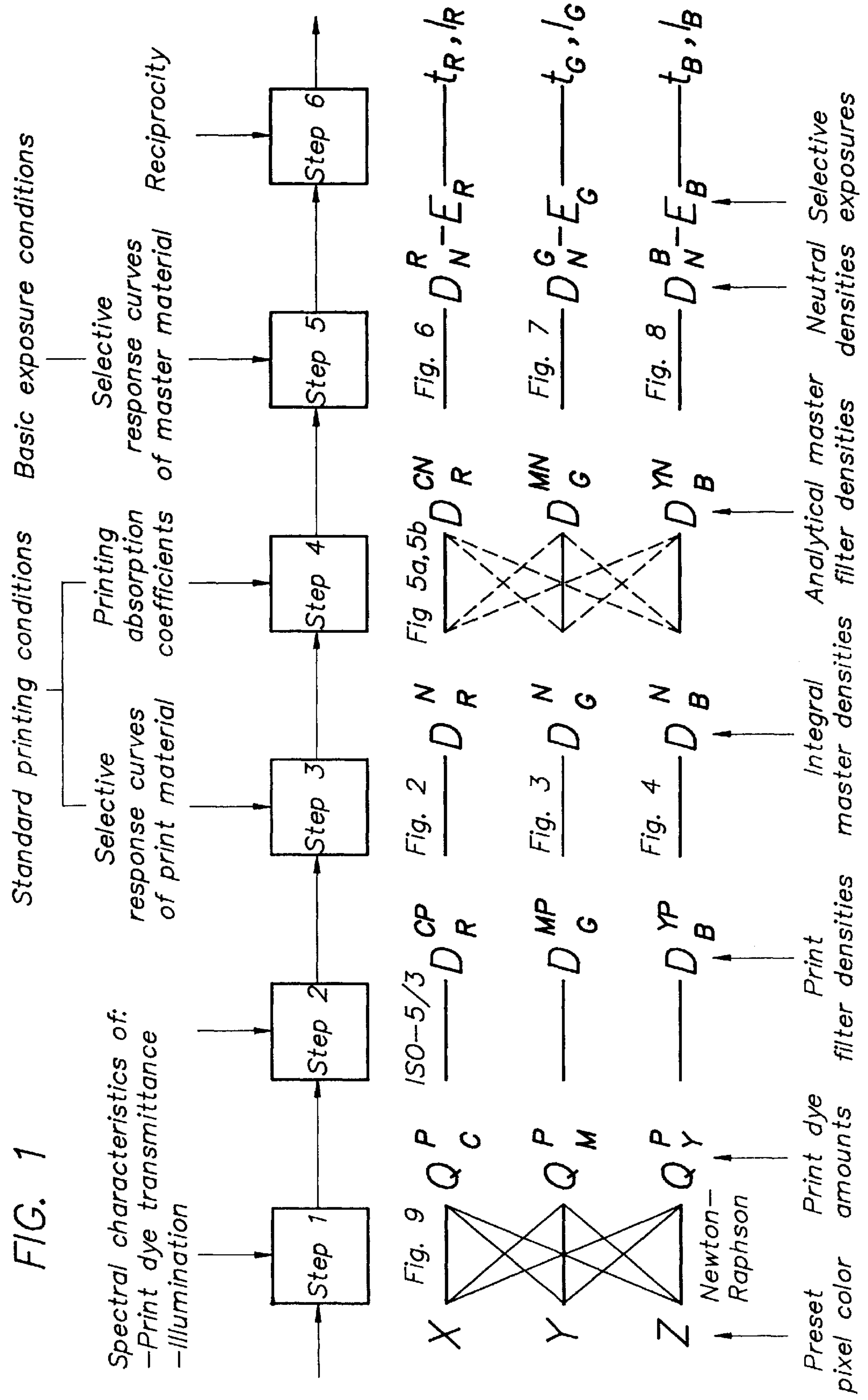
FIG. 1 shows a work scheme of the method according to one embodiment of the present invention.

While the present invention will hereinafter be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appending claims.

Before dealing with the description in detail of the present invention a survey of definitions and explanations of terms used herein is given.

Positive multi-layer color photographic material, simply called hereinafter positive material or "print material" is a multi-layer color photographic material, suitable for the production of multi-color filter array elements for FPD's with high thermal stability and good color rendering properties.

Negative multi-layer color photographic material, simply called hereinafter negative material or "master material" is preferentially a multi-layer color photographic material suitable to be used as an intermediate or "master" in the production of multi-color filter array elements. The master material may be different from the print material in composition, number and order of layers.

Exposure is the product of time and illuminance on the photographic material. It is called selective when the radiant energy is restricted to a selected portion of the visual spectrum, usually the red (700–600 nm), green (600–500 nm) or blue (500–400 nm) region.

Printing light is the light used to expose the print material through a master. This operation is called printing. The exposed and developed print material is often called a "print".

Exposing light is the light used to expose the master material. In a preferred embodiment, such light is sent through a black and white mask (a continuous or a step wedge, a chromium mask, and so on). The term exposing light is introduced in this application to differentiate it clearly from the printing light. In practice they may be the same but they refer to two essentially different steps.

Basic exposure is the exposure without a light modulator (wedge, mask, negative). It is the exposure used to obtain the sensitometric curves of the master material (FIGS. 6–8) and print material (FIGS. 2–4) respectively.

Color filter densities are densities measured within relatively wide bands of energy. These filter densities are slightly different from spectral densities. A spectral density is a density for light having one specific wavelength. A filter density is a density for light having a specific range of wavelengths. A filter density may be measured by sending white light through a "band" filter, and measuring the radiant energy incident on and transmitted or reflected by the object to be measured. Filter densities are currently referred to as red, green and blue filter densities or simply red, green and blue densities. If they are measured on the print, they are indicated by $D_R^P$, $D_G^P$ and $D_B^P$ respectively and referred to as "print filter densities". If they are measured on the master, they are indicated by $D_R^N$, $D_G^N$ and $D_B^N$ respectively and referred to as master filter densities. If the master contains exclusively a cyan (C), magenta (M) or yellow (Y) master dye only, the superscript N is preceded by C, M or Y respectively to indicate this fact. Status A and status M densities are color filter densities commonly used in color photography (see International Standard ISO-5/3).

Integral (color) densities (designated by $D_R^P$, $D_G^P$ and $D_B^P$ on the print, by $D_R^N$, $D_G^N$ and $D_B^N$ on the master) are the result of the measurement of the integrated effect that the combined image absorptions of all dyes of a color image produce on a particular radiant energy distribution (R, G or B).

Analytical (color) filter densities ($D_R^{CN}$, $D_G^{MN}$ and $D_B^{YN}$ on the master) refer to the apparent amounts of dye C, M or Y in the individual layers of the image. They can be deduced from integral master density data by means of a 3×3 matrix (see Evans, Hanson and Brewer, Principles of Color Photography 1953, p. 441).

Main (color) density (indicated by $D_R^{CN}$, $D_G^{MN}$ and $D_B^{YN}$ on the master) is the filter density with the highest value for that particular color, e.g. the blue (B) filter density is the main density of a yellow dye (Y).

Secondary (color) densities (indicated by $D_R^{MN}$,$D_R^{YN}$, $D_G^{CN}$,$D_G^{YN}$ and $D_B^{CN}$,$D_B^{MN}$ on the master) are the color densities with values that are lower than the main density of that particular color. Secondary densities are caused by so-called unwanted or secondary absorptions of the dyes. Magenta dyes e.g. have rather high secondary blue density values.

Printing densities of a colored master specify the effect of the negative (in fact a specified colored area of it) in reducing the exposure received by the print material. The printing system must be well defined, because this effect depends on the exposure and the spectral distribution of the printing light.

Instrument densities are densities (status A, status M or others) measured with a specific densitometer. They may be different from the densities computed from the spectral transmittance data of a sample.

x and y are chromaticity coordinates of a color stimulus in the CIE XYZ system.

u' and v' are chromaticity coordinates of a color stimulus in a uniform chromaticity diagram introduced by the CIE in 1976.

The master-print, more specifically a "negative-positive", color filter production process can be generally described as follows.

A black and white mask with a regular pattern of clear areas (stripes, squares, rectangles, circles or whatever form the pixels have), corresponding with one kind of pixels in the print to be produced, e.g. the red pixels, is placed in contact. or near contact, with a master material or negative multi-color material, preferably coated on a glass substrate.

This master material is exposed through the black and white mask to red, green and blue light successively or simultaneously, the intensity and duration of the exposures being carefully specified by a method which is part of the invention, in order to obtain a print or multi-color filter array element with correctly colored red pixels.

Next, the mask is displaced over a distance equal to the pixel pitch and a new set of carefully specified exposures to red, green and blue light is given to the master material in order to obtain correctly colored green pixels on the print.

Subsequently the mask is again displaced over a distance equal to the pixel pitch and a last set of well specified exposures to red, green and blue light is given in order to obtain correctly colored blue pixels on the print.

If the dimensions of the clear area in the black and white mask are smaller than the pixel pitch, an unexposed area is left between the pixels.

Instead of using one mask, that has to be displaced over a given distance between exposures, three separate masks for the red, green and blue pixels on the print may be used.

After color processing of the thus exposed master material, a negative master is obtained with predominantly cyan, magenta and yellow colored pixel areas corresponding to the red, green and blue pixels in the print or color filter, with clear areas between and above the pixels on the master, corresponding to the black matrix in the print or color filter.

This negative master is placed in contact or near contact with a positive multi-color material, coated on a glass substrate, called print material. The print material is exposed through the negative master to red, green and blue printing light simultaneously or consecutively. This type of exposure or printing is called additive.

Another type of printing called subtractive makes use of white light, combined with cyan, magenta and yellow filters. In this case the spectral composition of the printing light is controlled by subtraction of red, green and blue light, from white light, the extent of subtraction depending on the density of the cyan, magenta and yellow filters used.

More details about additive and subtractive printing can be found in "Your Film and the Lab" (L. B. Happé, Focal Press 1983, p. 46) and "The Reproduction of Color" (R. W. G. Hunt, Fountain Press 1967, p. 264 and following).

To fully exploit the advantages of this invention, the single step exposure of the print to printing light of the additive type is preferred. After color processing of the thus exposed print material, a filter array element or print with red, green and blue pixels in a black matrix is obtained. This print can be incorporated in a flat panel display.

In order to fully understand the meaning of the different steps, forming part of the invention, let us consider more in detail the production of the master and what happens during printing of the negative master onto the print material and how some characteristics of the master dyes of the negative master influence the printing process.

Let us first consider the case that just one region on the master material is exposed, in order to finally obtain just one monochrome colored region on the print. Suppose that such a region on the master material is exposed to red exposing light, with a specific spectral distribution obtained by filtering white light through an L622 filter (cut off filter for wavelengths below 622 nm), with a specific illuminance of 60 lux, during an exposure time $t_R^N$=2 seconds. The red exposing light will impinge on the red sensitive layer within the master material, on the green sensitive layer and on the blue sensitive layer. Preferentially, the sensitivity of each layer in the master material is conditioned by photochemical means such, that only the red sensitive layer in the master material is affected by the red exposing light. As such, the green and blue sensitive layers in the master material are not affected at all by the red exposing light.

After exposing the master material with red exposing light, the master material is exposed to green exposing light, obtained by filtering white light by a U535 filter (band pass filter with maximum transmittance at 535 nm), with a specific illuminance of 60 lux, during an exposure time $t_G^N$=2 seconds. The green exposing light will impinge on the red sensitive layer within the master material, on the green sensitive layer and on the blue sensitive layer. Preferentially, the sensitivity of each layer in the master material is conditioned by photochemical means such, that only the green sensitive layer in the master material is affected by the green exposing light. As such, the red and blue sensitive layers in the master material are not affected at all by the green exposing light. The same can be said from a subsequent exposure of the master material to blue exposing light, obtained by filtering white light through a U449 filter (band pass filter that has a maximum transmittance at 449 nm), with a specific illuminance of 6 lux, during an exposure time $t_B^N$=1 second. Only the blue sensitive layer within the master material is affected by the blue exposing light.

After these three exposure steps, the master material is chemically developed in a suitable solution. In a preferred embodiment, the master material is designed such that the affected red sensitive layer causes the formation of a cyan dye in the master material during the development step. The cyan dye originates from a so-called color coupler, contained within the red sensitized silver halide emulsion layer. The color coupler is colorless in the master material and forms by color development a cyan dye on the exposed portions of the silver halide emulsion layer. A dye which is formed in the master material is called further on a master dye, to differentiate it from a print dye, formed in the print material (see below). Preferentially, the master material is designed such that neither the affected green sensitive layer, nor the affected blue sensitive layer, contribute to the formation of cyan master dye. This means that the amount of cyan master dye formed is only dependent on the exposure to red light. If $t_R^N$ would have been just one second, then a lower amount of cyan master dye $Q_C^N$ would have been formed in the master material during color processing, completely independent from $t_G^N$ and $t_B^N$. This means that the amount of cyan master dye $Q_C^N$ in the master is dependent only on the exposure to red light. The same can be said from the affected green sensitive layer, which alone causes, during color processing of the master material, the formation of a magenta master dye only. As such, the amount of magenta master dye $Q_M^N$ in the master is dependent only on the exposure to green light. The same applies for the blue sensitive layer in the master material, which causes the formation of a yellow master dye, such that the amount of yellow master dye $Q_Y^N$ depends only on the exposure to blue light. In the photographic art this feature is commonly known as the absence of inter-image effects in the master material. In the rest of this disclosure we suppose that inter-image effects are absent or at least negligible.

As a result of exposing the master material to three exposing light beams and subsequent processing, a master is formed which has three superimposed master dye layers: a cyan master dye layer, a magenta master dye layer and a yellow master dye layer.

This master is now used to modulate the printing light, which exposes the printing material. Let us consider the case that the print material is consecutively exposed to a red printing light beam, a green printing light beam and a blue printing light beam. In this embodiment, each printing light beam must traverse the three master dye layers on the master. The red printing light beam will first impinge on the master and a portion of the incident radiant energy will traverse or be transmitted by the master. The fraction of the transmitted radiant energy with respect to the incident radiant energy is the transmittance T of the master. Because the radiant energy is constrained to a small spectral band, known as red light, the transmittance is a spectral transmittance with respect to red light $T_R$. In photography it is common to convert this multiplicative fraction $T_R$ to an additive value $D_R$ by taking the decimal logarithm of the reciprocal fraction: $D_R=\log_{10}(1/T_R)$. $D_R$ is known as the "red" filter density, because it relates to a restricted spectral band (filter) of red light. To indicate that this filter density $D_R$ is caused by the master, the superscript N is added: $D_R^N$. As said before, the filter density $D_R^N$ may be measured by a color densitometer, preferentially as a status A density.

The red printing light beam transmitted by the master has traversed three master dye layers: cyan, magenta, yellow. Ideally, only the cyan master dye layer reduces the incident radiant energy to the transmitted radiant energy, such that the filter density $D_R^N$ of the master is completely and exclusively attributable to the cyan master dye layer. In that case, the logarithm of the amount of reduction or the filter density $D_R^N$ is almost a linear function of the amount of cyan master dye $Q_C^N$ in the master. In a first approximation this ideal assumption gives fairly correct results, and may be applied in a method according to the current invention in its broadest form. The same assumptions may be made for the green printing light beam, which is ideally reduced only by the magenta master dye, such that the green (G) filter density (D) of the master (N) $D_G^N$ is exclusively an almost linear function of the amount of magenta master dye $Q_M^N$. Ideally, the blue printing light beam is reduced only by the yellow master dye, such that $D_B^N$ is a function of $Q_Y^N$ only, which is almost linear. Later on, the nonideal situation will be discussed, wherein e.g. the magenta master dye layer contributes to the blue filter density $D_B^N$, which is ideally attributable to the yellow master dye layer only.

The red printing light, ideally attenuated by the cyan master dye layer only, impinges on the print material. The print material has, comparable to the master material, a red sensitive layer, which is effectively sensitive to red printing light only.

The green printing light, ideally attenuated by the magenta master dye layer only, impinges on the print material. The print material has, comparable to the master material, a green sensitive layer, which is effectively sensitive to green printing light only.

The blue printing light, ideally attenuated by the yellow master dye layer only, impinges on the print material. The print material has, comparable to the master material, a blue sensitive layer, which is effectively sensitive to blue printing light only.

After exposing the print material to the three printing light beams, it is color developed in a convenient chemical solution. In the same way as for the master material, the red sensitive layer in the print material causes the formation of a cyan print dye in the print material; the green sensitive layer causes the formation of a magenta print dye; the blue sensitive layer causes the formation of a yellow print dye.

Due to the absence or negligible presence of sensitivity of each sensitive layer for other light beams and inter-image effects, the amount (Q) of cyan (C) print (P) dye $Q_C^P$ on the print after developing the print material is exclusively caused by the amount of radiant energy of the red (R) printing (P) light beam transmitted (T) by the master $P_R^T$ In the same way, the amount of magenta print dye $Q_M^P$ is influenced only by the transmitted radiant energy of the green printing light beam $P_G^T$. The amount of yellow print dye $Q_Y^P$ may be computed unambiguously from the transmitted radiant energy of the blue printing light beam $P_B^T$.

The print dye layers formed in the print will modulate the spectral power distribution of the light source used for back lighting in the liquid crystal display. The modulated light has now a specific spectral distribution, which is perceived as a specific color by the human eye. The spectral distribution may be converted to a calorimetric specification such as (X,Y,Z) etc, in order to objectively characterise the color as perceived.

Let us consider the red pixels in a color filter array element or print as an example. To make them match a given red primary, calorimetrically specified by its (X,Y,Z) tristimulus values, they must contain, according to the principles of subtractive color mixtures, a certain amount of yellow $Q_Y^P$ and magenta $Q_M^P$ and a very small amount of cyan $Q_C^P$, if any. As explained already, the amount of yellow print dye $Q_Y^P$ corresponds unambiguously to a specific status A analytical filter density for blue light $D_B^{YP}$ (print filter density) of the yellow print dye. Analogously, $Q_M^P$ corresponds to $D_G^{MP}$ and $Q_C^P$ corresponds to $D_R^{CP}$.

Figure 3:
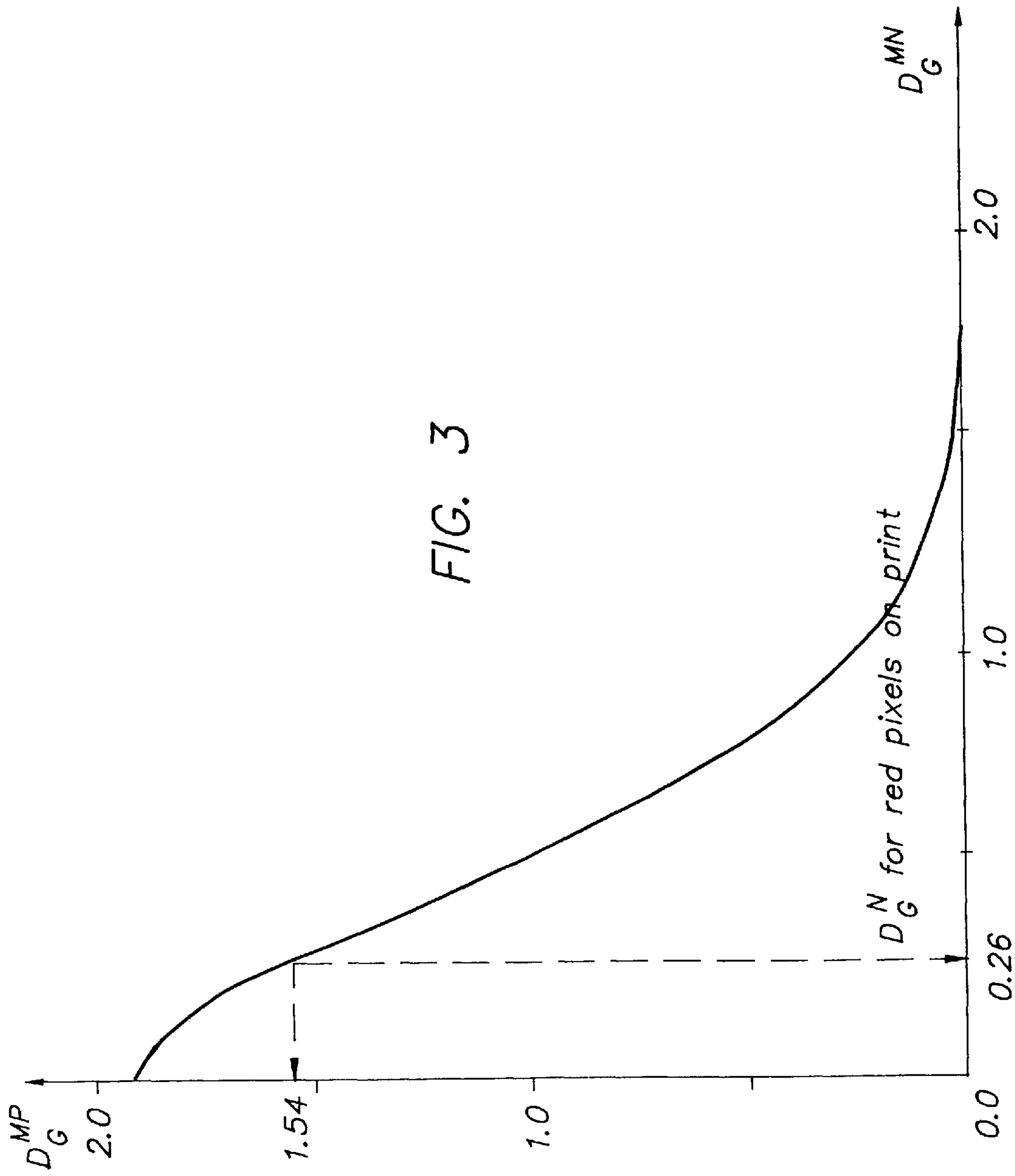
FIG. 3 shows a graphical representation of the response of a print material to selective exposure to green printing light through a wedge colored exclusively with a magenta master dye, displaying $D_G^{MP}=f(D_G^{MN})$.
Figure 4:
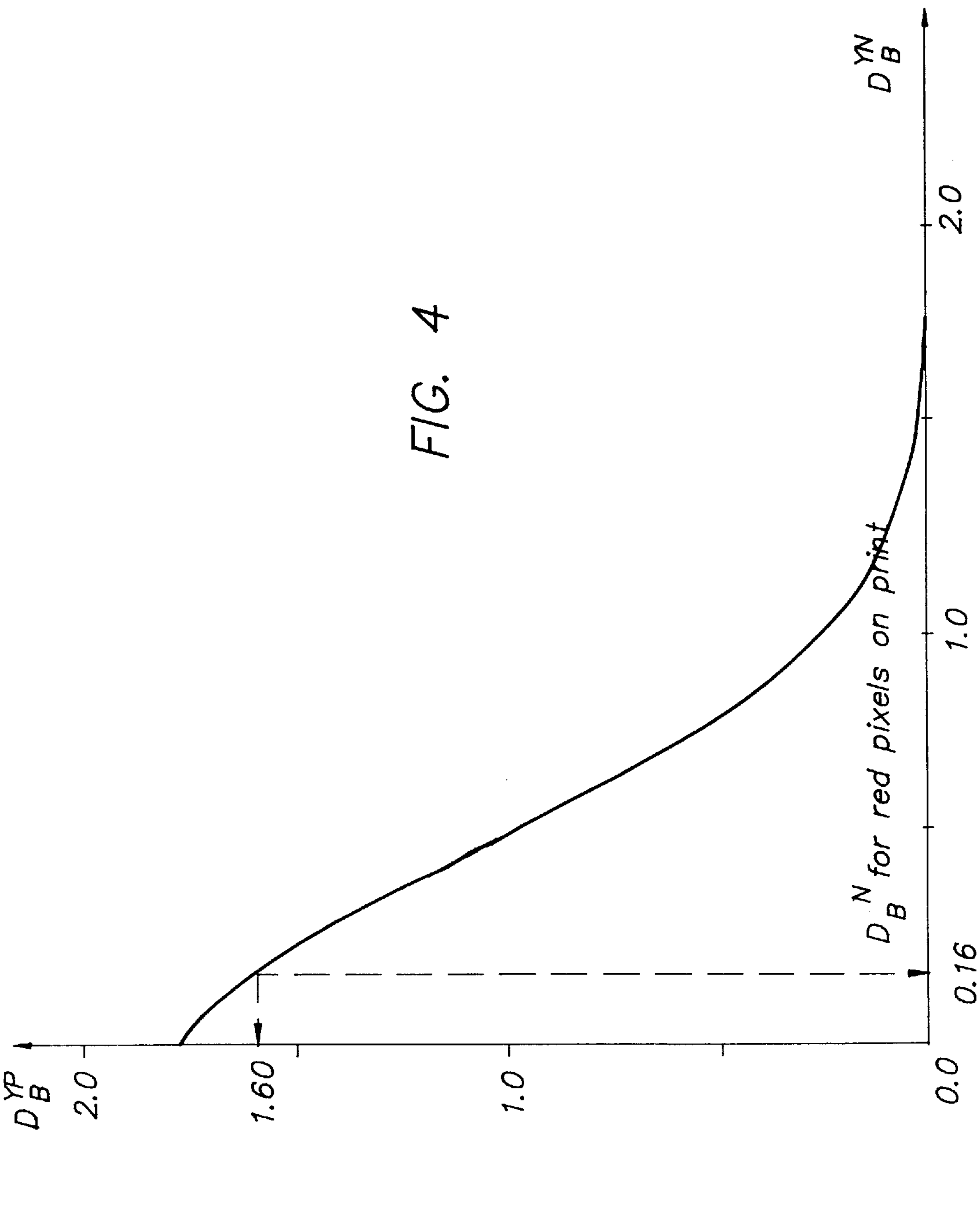
FIG. 4 shows a graphical representation of the response of a print material to selective exposure to blue printing light through a wedge colored exclusively with a yellow master dye, displaying $D_B^{YP}=f(D_B^{YN})$.

These analytical filter densities on the print, further referred to as "print filter densities" ($D_R^{CP}$,$D_G^{MP}$,$D_B^{YP}$) can be related to analytical filter densities on the master, further referred to as "analytical master filter densities" ($D_R^{CN}$, $D_G^{MN}$,$D_B^{YN}$). This relation is preferentially obtained from the sensitometric curves (FIGS. 2–4).

Figure 2:
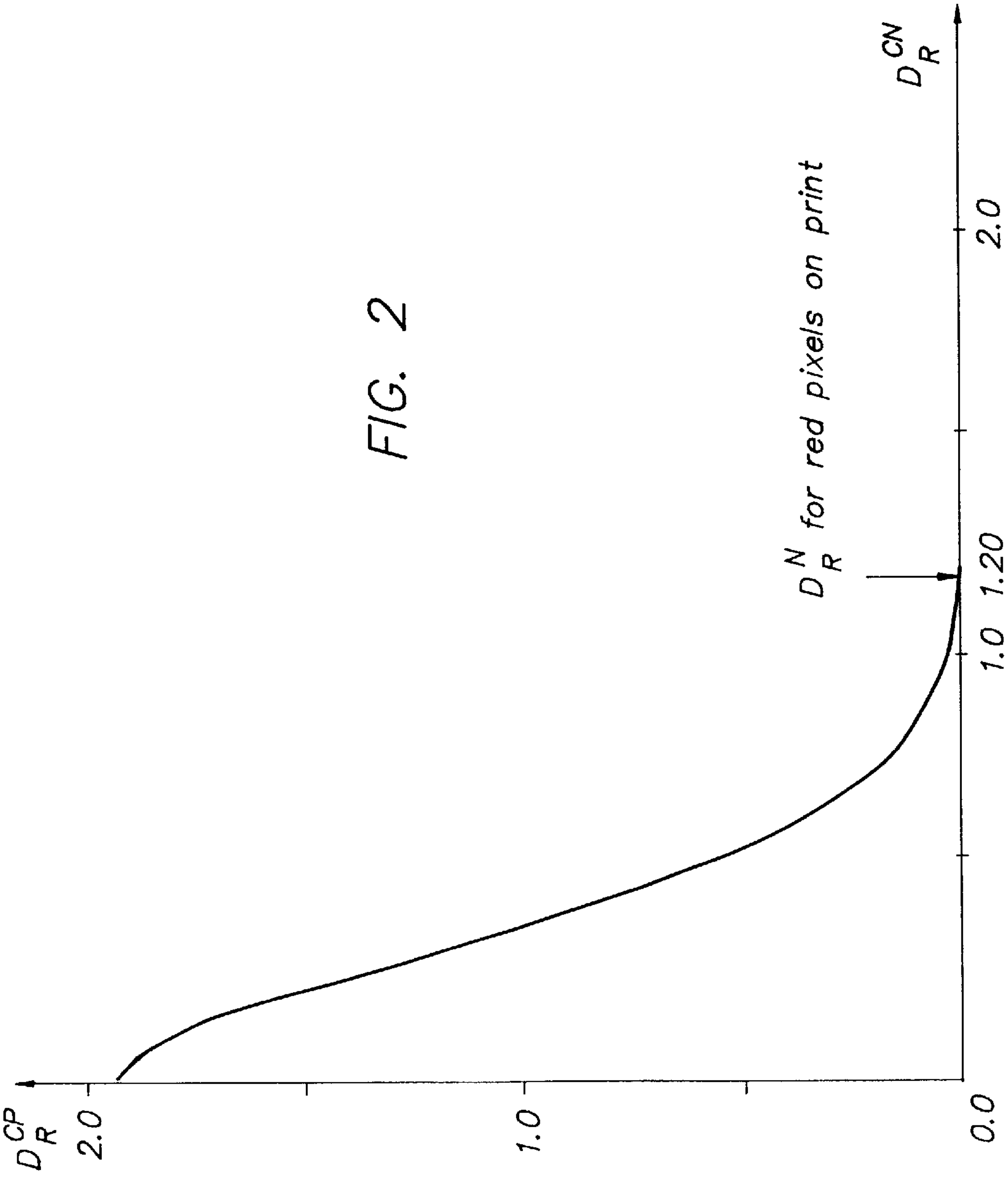
FIG. 2 shows a graphical representation of the response of a print material to selective exposure to red printing light through a wedge colored exclusively with a cyan master dye, displaying $D_R^{CP}=f(D_R^{CN})$.

FIG. 2 describes the response $D_R^{CP}$ of the print material to the red printing light $P_R^T$ transmitted through a cyan wedge with varying filter density $D_R^{CN}$. The curve in FIG. 2 has been obtained by the following process. A cyan colored wedge has been manufactured by exposure of the master material to red exposing light only. The intensity of the red exposing light is varied spatially to obtain a cyan wedge on the master. The spatial variation may be done by modulating the red exposing light beam with a neutral grey wedge. As stated before, by this method a purely cyan colored wedge on the master is obtained. After color processing, the red filter status A density of the wedge is measured, at different locations on this cyan wedge, and plotted in abscissa on FIG. 2. This analytical master filter density is identified as $D_R^{CN}$, because it is the red (R) filter density of a single cyan (C) dye layer on the master (N). This cyan master wedge is subsequently printed on the print material by a red printing light beam under fixed standard printing conditions. These printing conditions are characterised by:

- illumination of the cyan wedge by a halogen lamp, operating at 150 Watt and arranged to cause an illuminance of 60 lux;
- a red filter, known in the art under L622 modulates the light emitted by the halogen lamp;
- a neutral filter, having a density D=0.50 modulates red filtered light; and,
- the exposure time to the printing light is 2 seconds.

After exposure of the print material under these printing conditions and by modulation of the red printing light by the cyan wedge, the print material is color processed according to standard processing conditions at 25° C. As discussed above, exposing the print material to red printing light and subsequent color development causes the formation of a cyan print dye only on the print. Because the print material has been exposed to a modulated light beam, a cyan wedge with varying density is formed on the print. The red filter status A density of the cyan wedge on the print is measured, and plotted in ordinate $D_R^{CP}$ against the corresponding density $D_R^{CN}$ of the cyan wedge on the master. The measured data are connected by a fluent curve, giving the graph of FIG. 2. Here again the notation $D_R^{CP}$ is used to indicate that the red printing light forms a cyan (C) print dye layer only on the print (P), of which the red (R) filter status A density is most relevant to be measured, because it is the main color density.

FIG. 3 is obtained by a method analogous to that for obtaining FIG. 2. A master is produced comprising a purely magenta wedge. The green filter status A density is measured on various locations of the magenta master wedge and plotted in abscissa $D_G^{MN}$. A print material is exposed to green printing light—modulated by the magenta master wedge—with the following characteristics:

- halogen lamp 150 Watt, 60 lux;
- green filter U535: and,
- 2 seconds exposure time.

The exposed print material is subjected to standard processing at 25° C. After processing, a print is obtained having exclusively a magenta wedge. This magenta print wedge is subjected to the measurement of green filter status A density, giving a $D_G^{MP}$ value at each location corresponding to a location on the magenta master wedge, where a density of $D_G^{MN}$ was measured. The filter density $D_G^{MP}$ on the print is plotted in ordinate for each measured value and a fluent curve connects the ($D_G^{MN}$,$D_G^{MP}$) pairs.

FIG. 4 is obtained in an analogous way, by generating a yellow master wedge, used to modulate a blue printing light beam on the print material, with the following specifications for the printing conditions:

- halogen lamp at 150 Watt, 60 lux;
- blue filter U449:

neutral filter with density D=1.0; and 1 second exposure time.

After printing, the exposed print material is subjected to standard processing at 25° C. Blue filter status A densities are measured on the yellow master wedge, giving $D_B^{YN}$, which are plotted in abscissa and the same type of densities are measured on the yellow print wedge, giving $D_B^{YP}$, which are plotted in ordinate. The fluent curve in FIG. 4 connects the coordinate pairs.

From these FIGS. 2 to 4, we find by inverse evaluation that the pixels on the negative master must contain rather moderate amounts of yellow DBYN and of magenta $D_G^{MN}$ and a high amount of cyan $D_R^{CN}$.

The high amount of cyan in the negative master is needed to reduce the red exposure in the printing step to a negligible level (as seen by the print material).

Due to its rather broad absorption spectrum, the cyan dye in the negative master dims also—be it to a much lesser extent—the green printing light and the blue printing light, i.e. it behaves in some way as a magenta and a yellow dye. The amounts of the yellow and magenta dyes, as deduced from the response curves for the print material (FIG. 4 and FIG. 3 respectively), should therefore be reduced taking into account the blue and green absorbing properties of the cyan dye.

Furthermore, the magenta dye in the negative master reduces the green printing light exposure to some expected level, but at the same time lowers slightly the blue printing light exposure, i.e. behaves in some way as a yellow dye. This makes a further reduction of the amount of yellow dye in the negative necessary. The above described "misbehaviours" of the negative dyes cause color distortions if one does not take them into account.

Mathematically, these effects may be described as follows. The red printing light with an amount of radiant energy $P_R$ impinges on the master and traverses the three master dye layers: cyan, magenta, yellow. A restricted portion $P_R^T$ is transmitted by the master material. The negative decimal logarithm of the fraction of the transmitted radiant energy in the spectral band for red, may be indicated by $D_R^N=-\log_{10}(P_R^T/P_R)$, and is called the integral red (R) density on the master (N). This integral red density of the master $D_R^N$ is mainly due to the (analytical) red (filter) density $D_R^{CN}$ of the cyan master dye layer, but may also be attributed partly to the magenta (M) master dye layer, for an amount indicated by $D_R^{MN}$, and is partly caused by the yellow (Y) master dye layer, for an amount indicated by $D_R^{YN}$. Because of the additive properties of the densities, these contributions to the integral red density on the master may be written as:

$$D_R^N=D_R^{CN}+D_R^{MN}+D_R^{YN} \quad (1)$$

This expression can be read as follows: the integral red density of the master $D_R^N$ may be attributed to the density of:

the cyan master dye layer for red printing light $D_R^{CN}$;

the magenta master dye layer for red printing light $D_R^{MN}$; and, the yellow master dye layer for red printing light $D_R^{YN}$.

In the same manner, the integral green density of the master $D_G^N$ may be attributed to the density for green printing light of the cyan, magenta and yellow master dyes. The same applies for the integral blue density of the master $D_B^N$:

$$D_G^N=D_G^{CN}+D_G^{MN}+D_G^{YN} \quad (2)$$

$$D_B^N=D_B^{CN}+D_B^{MN}+D_B^{YN} \quad (3)$$

In modern negative color materials, the effect of these undesired absorptions ($D_R^{MN}$,$D_R^{YN}$, $D_G^{CN}$,$D_G^{YN}$, $D_B^{CN}$, $D_B^{MN}$) is greatly eliminated by masking. To this end, colored couplers are incorporated in the negative material (cfr. master).

Current negative color materials for still and for motion picture photography contain cyan couplers, which are inherently colored red, usually called red colored cyan couplers; and yellow colored magenta couplers. These special couplers mask the unwanted absorptions of the cyan negative dyes in the green and the blue regions and of the magenta dyes in the blue region.

The undesired effects of the magenta negative dye on the red exposure and of the yellow negative dye on the green and red exposures are generally left unmasked because of their rather small impact on the color rendition and also because there are no adequate chemical means for masking them.

Correct masking by means of colored couplers is thus possible for the major portion of the undesired effects but not for all.

Furthermore colored couplers in the negative material makes the latter more complicated and very much different from the positive material. This makes the negative-positive process more costly. We have found that the above described undesired effects can be completely eliminated without the use of colored couplers or other special chemical means in the negative material by discounting the unwanted absorptions of the negative dyes to printing light, as observed by the positive material, in the computation of the effective amounts of the negative dyes.

To this end the secondary printing densities ($D_R^{MN}$,$D_R^{YN}$, $D_G^{CN}$,$D_G^{YN}$, $D_B^{CN}$,$D_B^{MN}$) of the master dyes are deduced from response data of the print material and related to the corresponding analytical master filter densities ($D_R^{CN}$, $D_G^{MN}$,$D_B^{YN}$). In this way a set of printing absorption coefficients is generated.

Figure 5A:
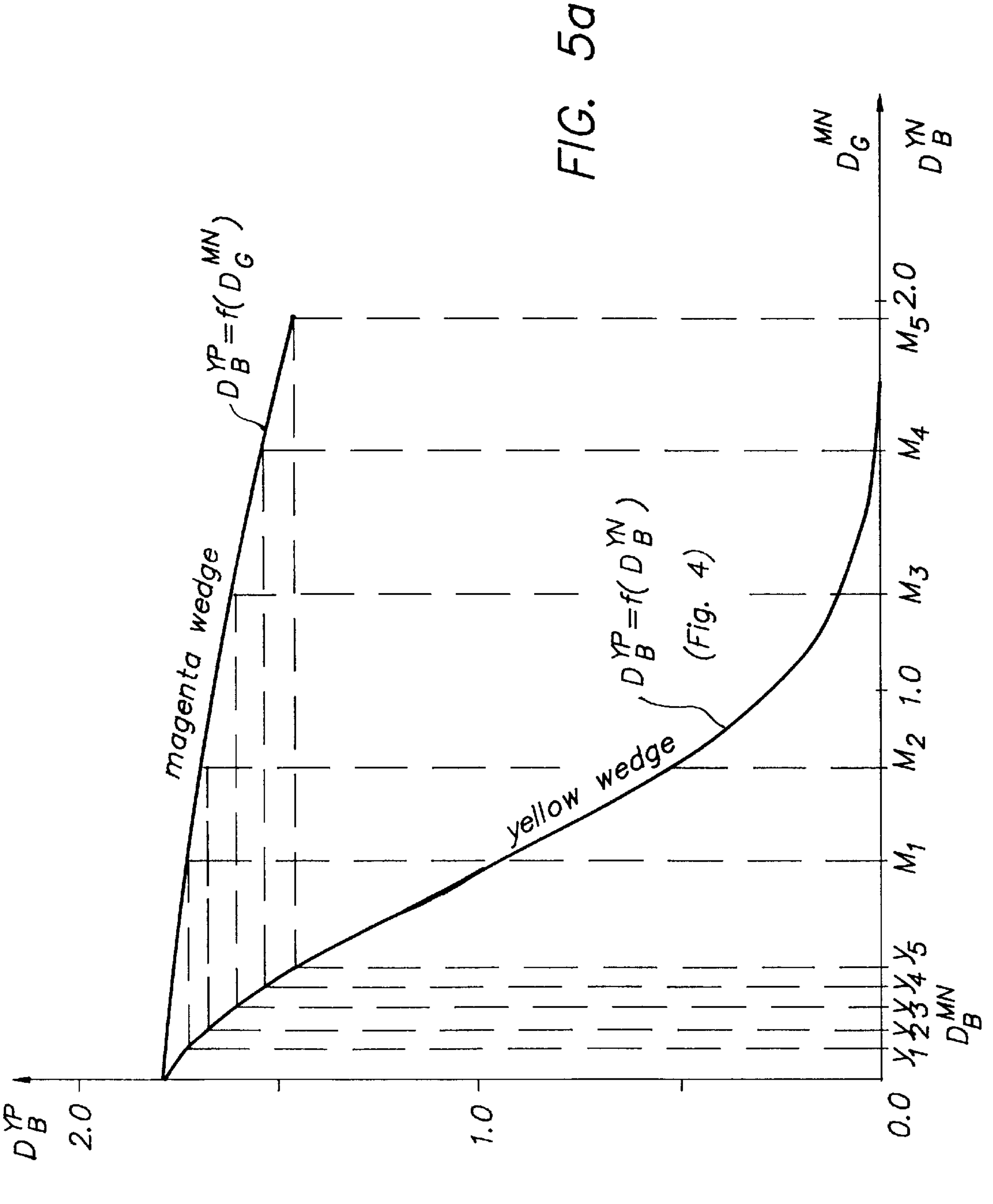
FIG. 5*a* retakes the curve of FIG. 4 together with a graphical representation of the response of a print material to blue printing light through a wedge colored exclusively with a magenta master dye, displaying $D_B^{YP}=f(D_G^{MN})$.
Figure 5B:
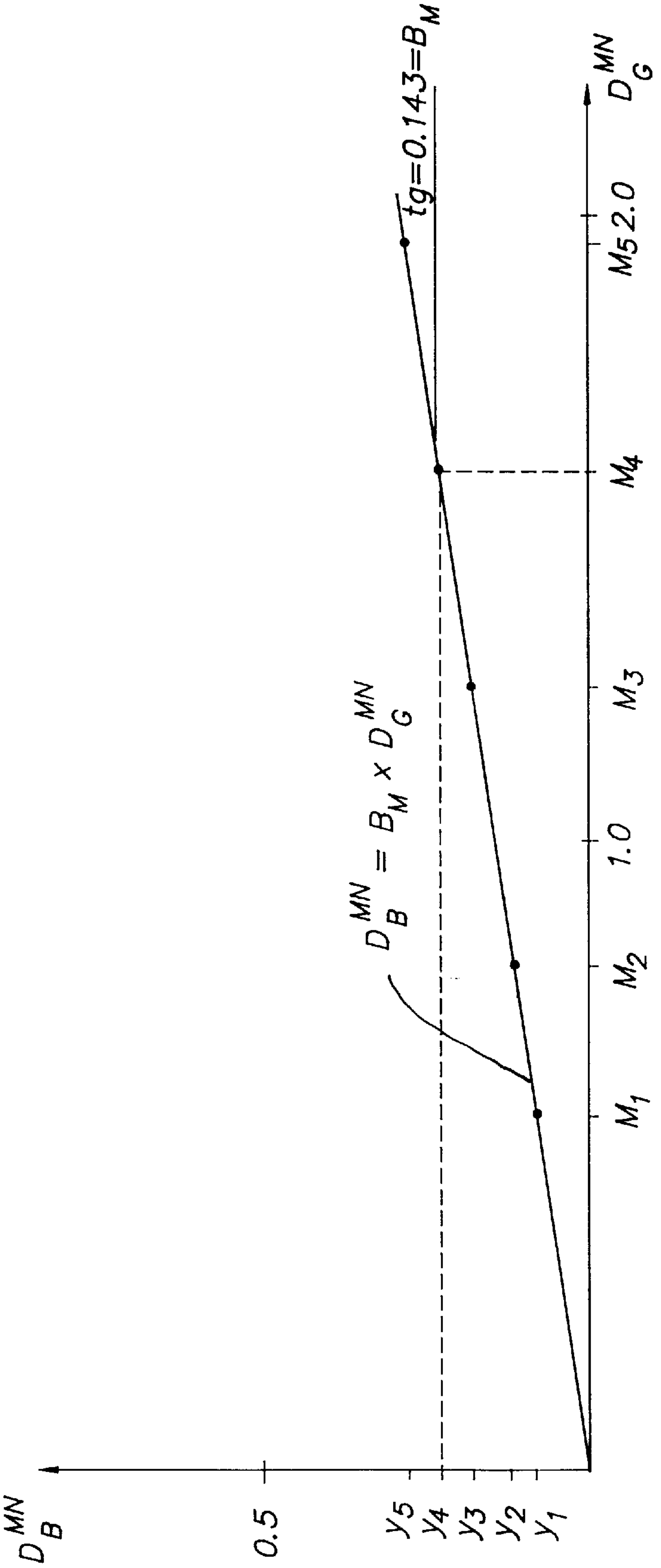
FIG. 5*b* shows an example of the way wherein a printing absorption coefficient $B_M$ may be computed. $D_B^{MN}=B_M \times D_G^{MN}$.

FIG. 5*a* and FIG. 5*b* illustrate a graphical method for the determination of this kind of coefficients.

In FIG. 5*a*, on the lowermost curve, the blue filter density of the yellow print dye ($D_B^{YP}$) is plotted against the analytical master filter density ($D_B^{YN}$) of a yellow colored master wedge, used to modulate the exposure to blue printing light. This is the same curve as the one described in conjunction with FIG. 4.

The uppermost curve in FIG. 5*a* displays again $D_B^{YP}$ plotted against the main density ($D_G^{MN}$) of a magenta colored master wedge, used to modulate the exposure to blue printing light. This curve gives thus an indication of the unwanted absorption of the magenta master dye to the blue printing light, which results in a lower formation of yellow dye in the print. If there were no unwanted absorption, the top curve would be horizontal.

The lowest curve in the graph thus refers to a yellow master wedge, and the upper curve refers to a magenta master wedge.

For a series of blue filter densities on the print $D_B^{YP}$, the corresponding analytical master filer densities ($D_B^{YN}\rightarrow Y_i$ and $D_G^{MN}\rightarrow M_i$) of the two colored master wedges are deduced from the two curves, as indicated in the figure by the straight lines parallel to the horizontal axis. $Y_i$ is a density of the yellow master dye that has the same "effect" $D_B^{YP}$ on the master as a density $M_i$ of the magenta master dye. In fact, the density $Y_i$ may be considered as the density of the magenta master dye layer for blue printing light $D_B^{MN}$.

By plotting in FIG. 5*b* the blue filter density, associated with the magenta master wedge ($D_B^{MN}$), and influencing as such the yellow wedge obtained on the print, against the analytical green filter density of the magenta master wedge ($D_G^{MN}$), one obtains a straight line. As will be discussed below, it is possible that the measured points are not on a straight line, but in that case a linear regression may be computed. The slope of this line defines the above mentioned blue (B) printing light absorption coefficient of the magenta (M) master dye $B_M$, such that the following relation is established:

$$D_B^{MN}=B_M \times D_G^{MN} \quad (4)$$

By plotting the blue filter density of the cyan master wedge ($D_B^{CN}$), which causes a density variation in the yellow print wedge, against the analytical red filter density of the cyan master wedge ($D_R^{CN}$), one obtains a straight line, the slope of which defines the above mentioned blue (B) printing light absorption coefficient of the cyan (C) master dye $B_C$:

$$D_B^{CN}=B_C \times D_R^{CN} \quad (5)$$

By substitution of (4) and (5) in (3), one obtains the relation:

$$D_B^N=B_C \times D_R^{CN}+B_M \times D_G^{MN}+1.0 \times D_B^{YN} \quad (6)$$

In the same manner, the green (G) printing light absorption coefficients of the yellow $G_Y$ and the cyan $G_C$ master dyes are determined; analogously the red (R) printing light absorption coefficients of the yellow $R_Y$ and magenta $R_M$ master dyes are determined. By definition, the blue, green and red printing light absorption coefficients of the yellow, magenta and cyan master dyes respectively are equal to 1.0.

In total a set of 3x3 printing light absorption coefficients is derived from the exposure data of the print material, giving the following relations from equations (1), (2) and (3):

$$D_R^N=1.0 \times D_R^{CN}+R_M \times D_G^{MN}+R_Y \times D_B^{YN} \quad (7)$$

$$D_G^N=G_C \times D_R^{CN}+1.0 \times D_G^{MN}+G_Y \times D_B^{YN} \quad (8)$$

$$D_B^N=B_C \times D_R^{CN}+B_M \times D_G^{MN}+1.0 \times D_B^{YN} \quad (6)$$

In matrix notation, these relations may be written as:

$$\begin{bmatrix} D_R^N \\ D_G^N \\ D_B^N \end{bmatrix} = \begin{bmatrix} 1.0 & R_M & R_Y \\ G_C & 1.0 & G_Y \\ B_C & B_M & 1.0 \end{bmatrix} \begin{bmatrix} D_R^{CN} \\ D_G^{MN} \\ D_B^{YN} \end{bmatrix} \quad (9)$$

By means of a 3x3 matrix inversion, the earlier derived integral master densities ($D_R^N$, $D_G^N$, $D_B^N$) are converted to a set of 3x3 analytical master filter densities ($D_R^{CN}$, $D_G^{MN}$, $D_B^{YN}$). These densities define the amounts of yellow, magenta and cyan that should effectively be present in the master, in order to obtain a print with the expected calorimetric characteristics.

According to a work scheme shown in FIG. 1, in a first step, the amounts of cyan, magenta and yellow print dyes ($Q_C^P$,$Q_M^P$,$Q_Y^P$) required in the print or multi-color filter array element, are computed. The combination of:

the above mentioned print dye amounts;

a given light source; and, possibly given spectrally active components (light polarizers, among others)

must match specified red, green and blue primaries (RGB) or (XYZ) etc. Suitable computational methods have been described by M. Vereycken (Lasers in Graphics/Electronic Design in Print 90—Conference Proceedings Vol. II, p. 127) and by N. Ohta, Applied Optics, Sept. 1971, vol. 10, no. 9, pp. 2183–2187. These amounts of print dyes may be expressed in arbitrarily chosen units. A very convenient unit is the amount of dye producing a density equal to 1.0 at the wavelength of maximum absorption.

In step 2 these print dye amounts ($Q_C^P$,$Q_M^P$,$Q_Y^P$) are converted into analytical print filter densities, e.g. analytical status A densities ($D_R^{CP}$,$D_G^{MP}$,$D_B^{YP}$).

From the response curves (FIGS. 2–4) of the print material to selective exposures through colored master wedges, the integral master densities ($D_R^N$,$D_G^N$,$D_B^N$)—corresponding to the analytical filter densities of the print ($D_R^{CP}$,$D_G^{MP}$,$D_B^{YP}$) found in step 2—are deduced. This is step 3. It is clear that the printing conditions in the color filter or print production process must match those of the response curve specification.

Figure 7:
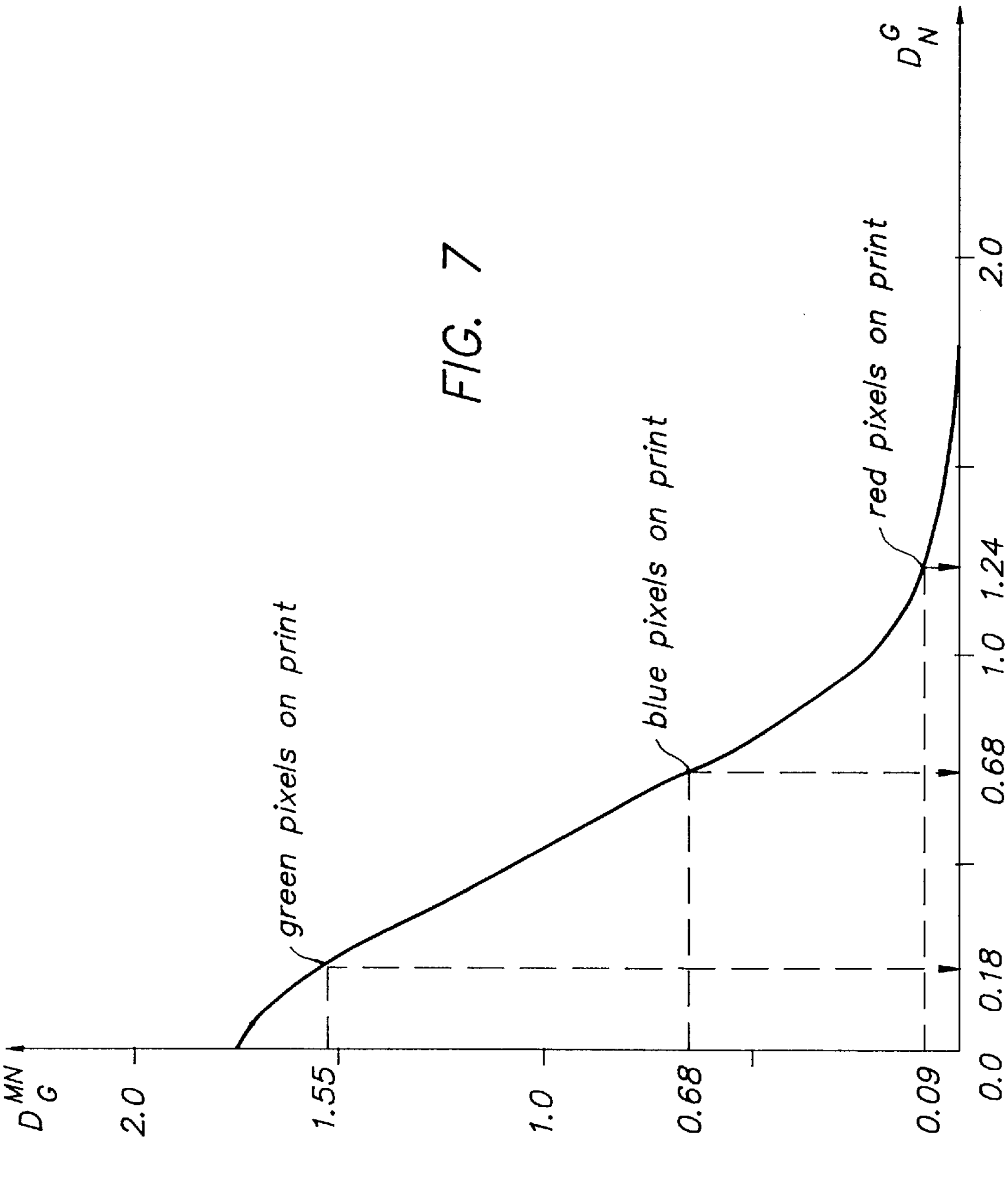
FIG. 7 shows a graphical representation of the response of a master material to selective exposure to green exposing light through a neutral non-selective wedge, displaying $D_G^{MN}=f(D_N^G)$.
Figure 8:
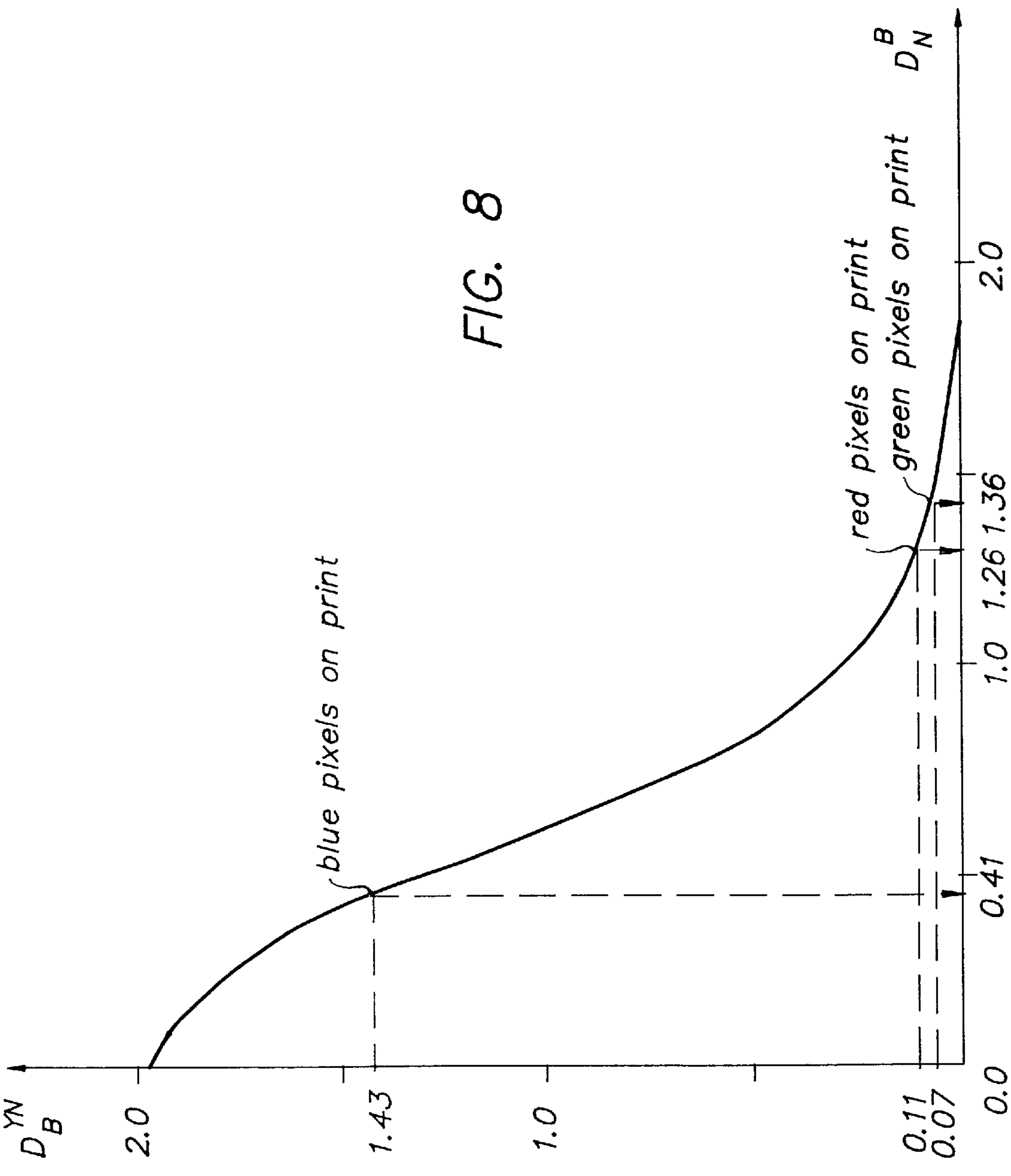
FIG. 8 shows a graphical representation of the response of a master material to selective exposure to blue exposing light through a neutral non-selective wedge, displaying $D_B^{YN}=f(D_N^B)$.

The integral master densities ($D_R^N$,$D_G^N$,$D_B^N$), found in step 3, are to be considered as integral densities. They are converted into analytical master filter densities ($D_R^{CN}$, $D_G^{MN}$,$D_B^{YN}$) in step 4. Step 5 involves the deduction of selective exposures of the master material from the response curves of the master material (FIGS. 6–8).

Figure 6:
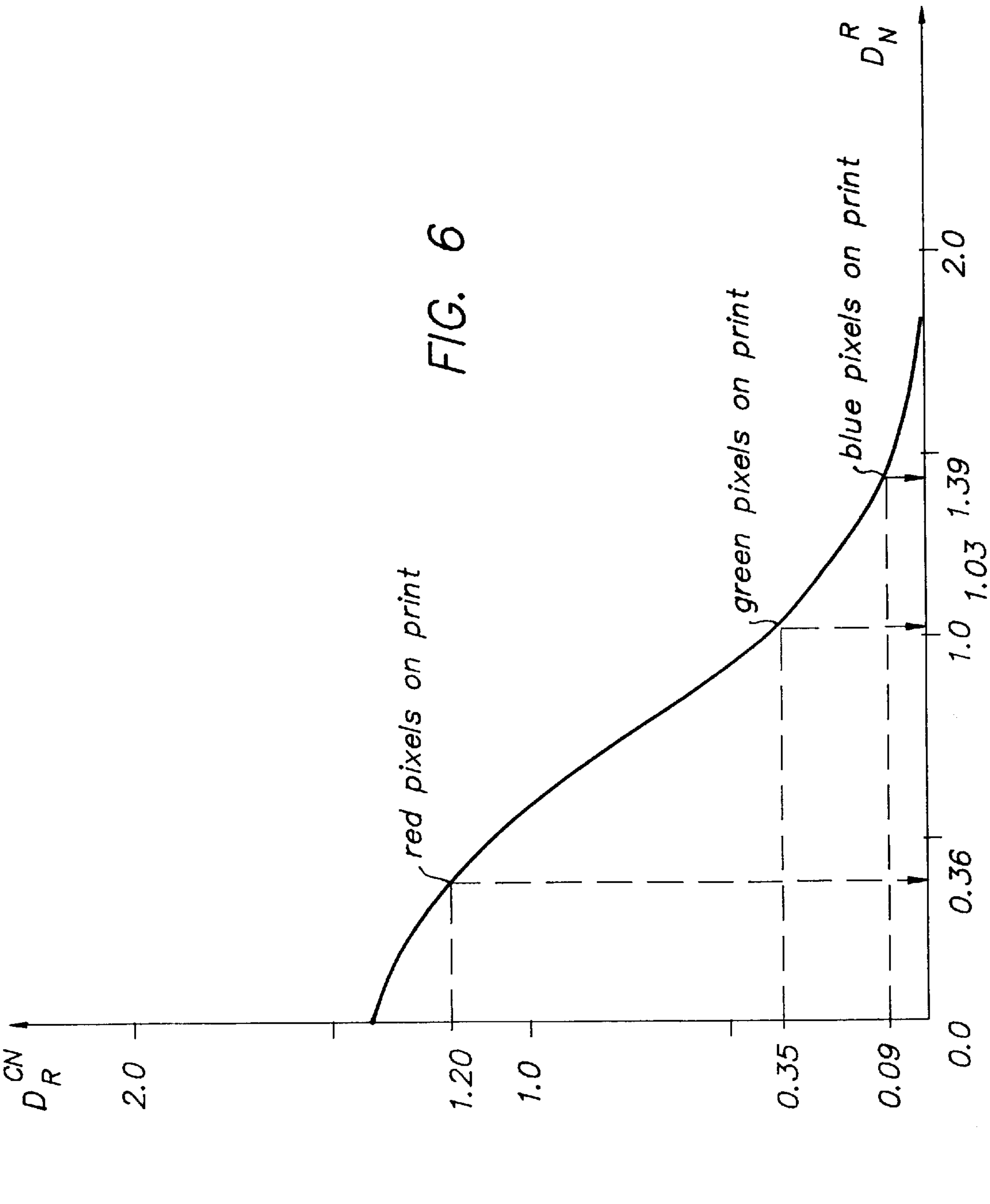
FIG. 6 shows a graphical representation of the response of a master material to selective exposure to red exposing light through a neutral non-selective wedge, displaying $D_R^{CN}=f(D_N^R)$.

FIG. 6 was obtained by the following method. The master material was exposed to a red exposing light beam, with the following standard exposure conditions, and modulated by a neutral grey wedge:

illumination of the neutral grey wedge by a halogen lamp, operating at 150 Watt and arranged to cause an illuminance of 60 lux;

a red filter, known in the art under L622 modulates the light emitted by the halogen lamp;

2 seconds exposure time.

The exposed master material was subjected to standard processing at 25° C. A cyan wedge with varying density was formed on the master. The red filter status A density of the cyan master wedge was measured, and plotted in ordinate $D_R^{CN}$ against the corresponding density $D_N^R$ of the neutral (N) wedge illuminated by the red (R) exposing light beam. The measured data are connected by a fluent curve, giving the graph of FIG. 6. Here again the notation $D_R^{CN}$ is used to indicate that the red exposing light forms a cyan (C) master dye layer only on the master (N), of which the red (R) filter status A density is most relevant to be measured, because it is the main color density.

FIG. 7 is obtained by a method analogous to that for obtaining FIG. 6. The neutral density is measured on various locations of the neutral wedge and plotted in abscissa $D_N^G$. A master material is exposed to green exposing light—modulated by the neutral wedge—with the following characteristics:

halogen lamp 150 Watt, 60 lux;

green filter U535; and, 2 seconds exposure time.

The exposed master material is subjected to standard processing at 25° C. After processing, a master is obtained having exclusively a magenta wedge. This magenta master wedge is subjected to the measurement of green filter status A density, giving a $D_G^{MN}$ value at each location corresponding to a location on neutral wedge, where a density of $D_N^G$ was measured. The analytical green filter density $D_G^{MN}$ on the master is plotted in ordinate for each measured value and a fluent curve connects the ($D_N^G$,$D_G^{MN}$) pairs.

FIG. 8 is obtained in an analogous way, by modulating a blue exposing light beam on the master material, with the following specifications for the exposing conditions:

halogen lamp at 150 Watt, 60 lux;

blue filter U449:

neutral filter with density D=1.0; and 1 second exposure time.

The exposed master material is subjected to standard processing at 25° C. Neutral densities are measured on the neutral wedge, giving $D_N^B$, which are plotted in abscissa and blue filter status A densities are measured on the yellow master wedge, giving $D_B^{YN}$, which are plotted in ordinate. The fluent curve in FIG. 8 connects the coordinate pairs.

Via the curves in FIGS. 6–8, the neutral filter densities ($D_N^R$,$D_N^G$,$D_N^B$), for modulating the red, green and blue exposing light beams respectively, may be computed, in order to result in the required analytical filter densities on the master ($D_R^{CN}$,$D_G^{MN}$,$D_B^{YN}$) computed in step 4.

For each type of pixels on the print, this results in three exposures ($E_R$,$E_G$,$E_B$), obtained unambiguously from the neutral filter densities ($D_N^R$,$D_N^G$,$D_N^B$) and the standard exposure conditions for the master material as defined above. Since three types of colored pixels are required on the print, this results in 3×3 exposures. It is equally clear that the exposure conditions for the master material in the color filter production process must match those of the response curve specification for the master material, as obtained from FIGS. 6–8.

The thus specified selective exposures ($E_R$,$E_G$,$E_B$) are converted in step 6 into exposure settings ($t_R$,$I_R$, $t_G$,$I_G$, $t_B$,$I_B$). I stands for the light intensity and t for the exposure time.

The exposure settings can be realized by adapting the light intensity I and/or the exposure time t. If the material is subject to reciprocity failure, it is preferable not to alter the exposure time t, or, if it cannot be kept constant for some reason, to take into account the effects of the reciprocity failure. As is well known, the reciprocity law states that the response of a particular photographic material in a specified developing process is defined primarily by the exposure, as earlier defined in this application, independent of the actual intensity or time considered separately.

The method as described above for defining the exposures to be given to the master and the print materials will be most successful if the photographic materials used do not exhibit inter-image effects, i.e. that the response of one layer is not influenced by the exposure and development in another layer. If however such effects are observed in the materials, some extra tuning might be necessary to compensate for their effects.

It is also clear that the materials should exhibit a sufficient degree of selectivity, which means that each layer responds within its usable density range only to light of the spectral region the layer has been sensitized for.

It must be emphasized that color materials, exhibiting no inter-image effects and with a high degree of selectivity of the individual layers and suitable for use in the production of a multi-color filter array element that can be incorporated in a FPD, more particularly a color LCD, can be made by properly choosing their constituents.

Before starting the procedure of establishing:

the exposure conditions of the master material; and, the printing conditions of the print material, one may preferentially put the following data in a data bank:

The spectral power distribution of the primary light source used for back-lighting.

The spectral transmittance of:

the light diffuser, the front and rear polarizers, the liquid crystal material, the glass substrates, the indium tinoxide electrodes, and other components that may influence the spectral power distribution of the light emerging from the LCD.

Figure 9:
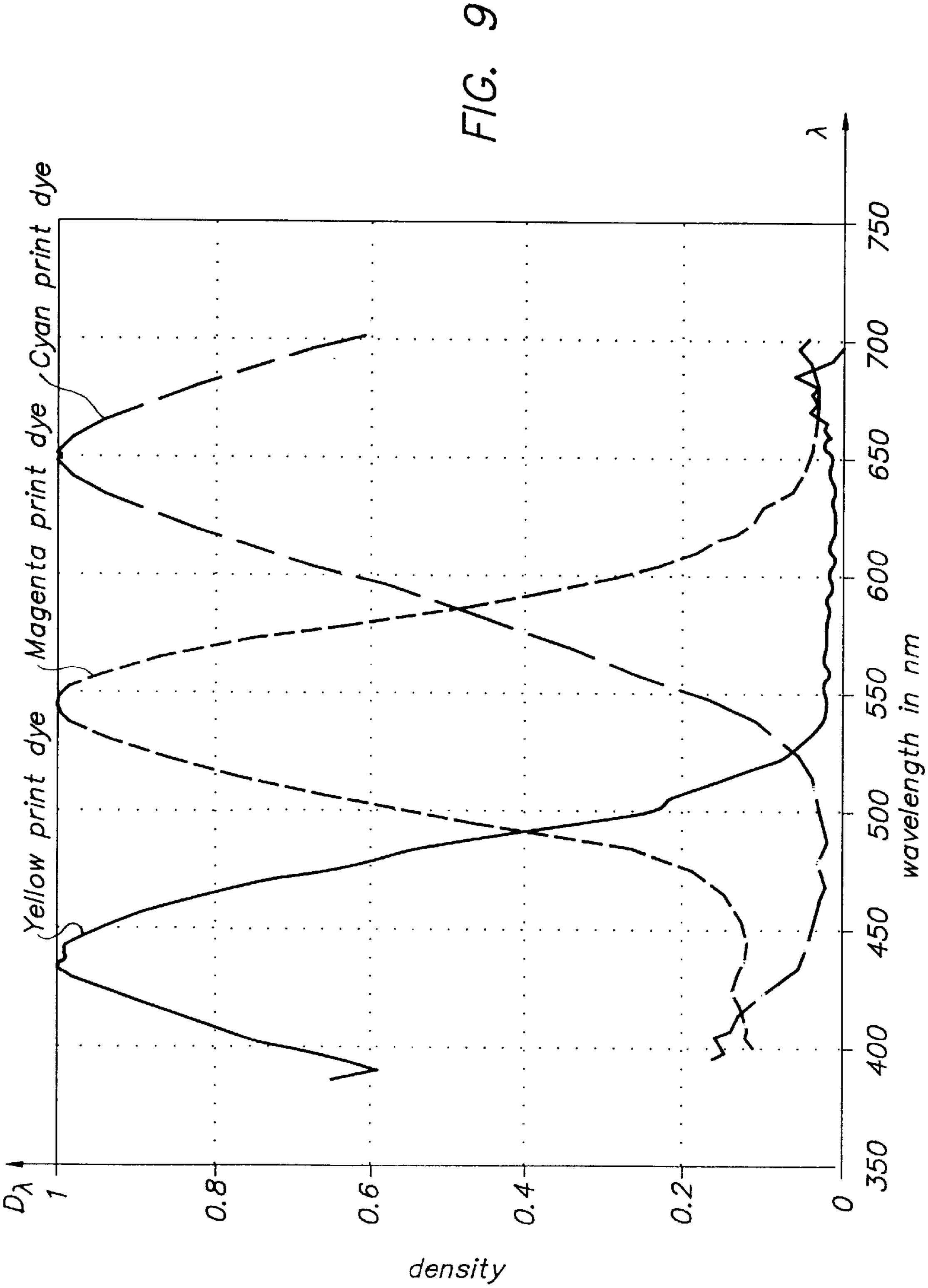
FIG. 9 shows the normalized absorption spectra of the cyan, magenta and yellow print dyes in graphical form.

The spectral transmittance of the yellow, magenta and cyan print dyes that are formed in the print material by chemical development. It is preferable to have those data in normalized form, such that at the wavelength of maximum absorption, the density is equal to 1.0. For highest accuracy, these data should be obtained from a series of dye amounts, created by selective exposure of the print material, through a non-selective neutral wedge and measuring the spectral transmittance of these master dye amounts, converting them to spectral densities, relating the densities over the whole visible range to the density at $\lambda_{max}$ and deriving the normalized spectrum by regression analysis. This is represented by FIG. 9.

The response of the print material to selective exposures, expressed as red, green and blue filter densities ($D_R^{CP}$, $D_G^{MP}$,$D_B^{YP}$), e.g. status A densities measured on the color developed print for a series of exposures to red, green and blue light through a colored master wedge, the exposures being expressed as the main densities ($D_R^{CN}$,$D_G^{MN}$,$D_B^{YN}$), e.g. in status A units of the colored master wedges. These response data may be acquired in a method as described in conjunction with FIGS. 2–4. Yellow, magenta and cyan master wedges may be obtained from the master material by selective exposure to red, green and blue exposing light through a neutral, non-selective wedge, used as light modulators. These master wedges are suitable to modulate the printing light for exposing the print material. The response data involved may be available in tabular form or as curves in a density versus exposure diagram (see FIG. 2, which shows an example of a series of red light exposures).

The response of the master material to selective exposures, expressed as analytical red, green and blue filter densities, e.g. in status A units ($D_R^{CN}$,$D_G^{MN}$, $D_B^{YN}$), measured on the color developed master for a series of exposures to red, green and blue light, the exposure being expressed as the visual densities or the densities to red, green and blue light, of the neutral modulator. The light modulator is a neutral, non-selective wedge. The response involved may be available in tabular form or as curves in a density versus exposure diagram (see FIG. 6, showing an example of a red light exposure). The color processing and the basic selective exposure must be carefully specified in both cases.

EXAMPLE

The following example illustrates the invention.

For a specific application, a color liquid crystal flat screen is needed with primaries, specified in the 1931 CIE calorimetric system as follows (Table I).

TABLE I

| pixels on LCD | x | y | Y |
|---|---|---|---|
| red | 0.62 | 0.34 | 14.9 |
| green | 0.32 | 0.59 | 41.2 |
| blue | 0.17 | 0.14 | 10.5 |

An F10 type fluorescent lamp is used as the back-light source (for spectrum of F10 see Measuring Color 1987 R. W. G. Hunt/Ellis Horwood Ltd. p. 189 and following).

The normalized absorption spectra of the cyan, magenta and yellow positive dyes are given in graphical form in FIG. 9.

Both the F10 emission spectrum and the normalised spectra of the positive dyes are stored in the data base.

For the sake of simplicity, the influence of spectrally active components like the polarizers, the liquid crystal material, among others is neglected in this example.

Starting with an arbitrary subtractive mixture ($Q_C^P$,$Q_M^P$, $Q_Y^P$) of cyan, magenta and yellow, one can compute the X, Y, Z and the corresponding x and y values for that mixture. These values very probably will deviate from the aim values (X,Y,Z).

Since X, Y and Z are dependent predominantly on the amounts of cyan, magenta and yellow respectively, their partial derivatives indicate in which direction the dye amounts should be changed to minimize the difference between the computed values and the aim values of X, Y and Z (or x, y and Y).

The Newton-Raphson approach is very well suited for this kind of estimation.

More information about the computation of dye mixtures that match specified colors can be found in the aforementioned publications of M. Vereycken and N. Ohta.

Table II gives the amounts of cyan ($Q_C^P$) magenta ($Q_M^P$) and yellow ($Q_Y^P$) (in normalized units) needed to match with an F10 back light source the R, G and B primaries of table I. From these amounts of cyan, magenta and yellow the corresponding status A densities for red ($D_R^{CP}$), green ($D_G^{MP}$) and blue ($D_B^{YP}$) light respectively are calculated (see ISO 5/3-1984).

These are analytical filter densities for the print. They are given also in table II.

TABLE III

| | Step 2 Analytical densities print | | | Step 3 Integral master densities | | |
|---|---|---|---|---|---|---|
| pixels | $D_R^{CP}$ | $D_G^{MP}$ | $D_B^{YP}$ | $D_R^N$ | $D_G^N$ | $D_B^N$ |
| red | 0.00 | 1.54 | 1.60 | 1.20 | 0.26 | 0.16 |
| green | 1.01 | 0.00 | 1.38 | 0.35 | 1.60 | 0.30 |
| blue | 1.80 | 0.59 | 0.03 | 0.09 | 0.76 | 1.53 |

According to a previously given definition we call the densities on the master "integral master densities", i.e. the densities of the multi-layer negative pixel images seen by the print material in the printing step, those densities depending not only on the composition of the negative image but also on the composition of the printing light. The integral master densities of table III are to be considered as integral densities since they result from the integrated effect of the 3 colored negative layers.

The integral master densities must be converted into analytical master filter densities for reasons explained earlier. This is the content of step 4.

The conversion of integral into analytical master filter densities can be done e.g. by means of a matrix shown in equation 9.

As described before, $D_R^N$ means the integral density of the master to red light.

$D_R^{CN}$ means the printing density of the cyan master dye layer to red light, indicated by the analytical master red filter density.

$R_M$ is a coefficient relating the red light printing density of the magenta master dye layer to the green light printing density of that same magenta master dye layer.

The meaning of $D_G^N$, $D_B^N$, $D_G^{MN}$, $D_B^{YN}$, $R_Y$, $G_C$, $G_Y$, $B_C$ and $B_M$ are analogous.

The inversion of the matrix equation (9) gives the values of $D_R^{CN}$, $D_G^{MN}$ and $D_B^{YN}$, these values being in fact the analytical filter densities of the master. The coefficients $R_M$, $R_Y$, $G_C$, $G_Y$, $B_C$ and $B_M$ can be found by a method explained in FIGS. 5*a* and 5*b*.

TABLE II

| | (X,Y,Z) | | | (x,y) | | Step 1 | | | Step 2 | | |
|---|---|---|---|---|---|---|---|---|---|---|---|
| pixels | X | Y | Z | x | y | $Q_C^P$ | $Q_M^P$ | $Q_Y^P$ | $D_R^{CP}$ | $D_G^{MP}$ | $D_B^{YP}$ |
| red | 27.04 | 14.90 | 1.84 | 0.62 | 0.34 | 0.00 | 1.66 | 1.68 | 0.00 | 1.54 | 1.60 |
| green | 22.64 | 41.20 | 6.10 | 0.32 | 0.59 | 1.16 | 0.00 | 1.46 | 1.01 | 0.00 | 1.38 |
| blue | 13.27 | 10.50 | 52.9 | 0.17 | 0.14 | 2.07 | 0.65 | 0.03 | 1.80 | 0.59 | 0.03 |

From the curves of FIG. 2 to FIG. 4, one can derive the status A densities ($D_R^N$,$D_G^N$,$D_B^N$) of the master that will give rise to the desired densities ($D_R^{CP}$,$D_G^{MP}$,$D_B^{YP}$) on the print under the specified printing conditions, which were used for the compilation of these figures.

By way of an example those densities on the master ($D_R^N$,$D_G^N$,$D_B^N$) are indicated for the red pixels on the print with an arrow on the horizontal axis in FIGS. 2 to 4 respectively.

Table III gives the analytical status A densities of the print (printer filter densities $D_R^{CP}$,$D_G^{MP}$,$D_B^{YP}$: 3 last columns of table II) and the corresponding status A densities of the master (integral master densities $D_R^N$,$D_G^N$,$D_B^N$), derived from the response curves of the print material in FIGS. 2, 3 and 4.

FIG. 5*a* shows in the lower curve the response of the print material to blue printing light, modulated by a yellow colored master wedge; the upper curve shows the response of the print material to blue printing light, modulated by a magenta colored master wedge in the printing light path.

The effect of the magenta master wedge is, as expected, much smaller than that of the yellow wedge. The densities on the horizontal axis in FIG. 5*a* are status A blue filter densities for the yellow master wedge ($D_B^{YN}$) and status A green filter densities for the magenta master wedge ($D_G^{MN}$). For each amount of magenta dye in the master, expressed as green filter density ($D_G^{MN}$), there is an amount of yellow dye in the master that has the same effect ($D_B^{MN}$) on the blue sensitive layer of the print material.

For a number of magenta analytical green filter densities $D_G^{MN}=M_j$, the corresponding yellow blue filter densities $D_B^{MN}=Y_j$ are derived. In FIG. 5*b*. the yellow master dye blue filter densities ($D_B^{YN}$), corresponding to the effect ($D_B^{MN}$) of the magenta master dye on the blue sensitive layer of the print material, are plotted versus the magenta dye analytical green filter densities ($D_G^{MN}$).

The slope of the straight line gives the coefficient $B_M$, which in the case considered is equal to 0.143.

When the function is not linear, other mathematical means must be used to describe the relationship between main (e.g. $D_G^{MN}$) and secondary (e.g. $D_B^{MN}$) printing densities, e.g. a third degree polynomial.

In a similar way, the remaining coefficients are determined. In our example the following matrix was obtained:

$$\begin{bmatrix} D_R^N \\ D_G^N \\ D_B^N \end{bmatrix} = \begin{bmatrix} 1.0 & 0.0 & 0.0 \\ 0.133 & 1.0 & 0.045 \\ 0.03 & 0.143 & 1.0 \end{bmatrix} \begin{bmatrix} D_R^{CN} \\ D_G^{MN} \\ D_B^{YN} \end{bmatrix} \quad (10)$$

From the inverse matrix the analytical filter densities for the master can be easily computed.

$$\begin{bmatrix} D_R^{CN} \\ D_G^{MN} \\ D_B^{YN} \end{bmatrix} = \begin{bmatrix} +1.0 & +0.0 & +0.0 \\ -0.132 & +1.006 & -0.045 \\ -0.011 & -0.144 & +1.006 \end{bmatrix} \begin{bmatrix} D_R^N \\ D_G^N \\ D_B^N \end{bmatrix} \quad (11)$$

Table IV shows the integral densities for the master, found in step 3 (see table III) and the corresponding analytical filter densities for the master, found by means of the above inverse matrix.

TABLE IV

| | Step 3 Integral master densities | | | Step 4 Analytical master filter densities | | |
|---|---|---|---|---|---|---|
| Pixel color | $D_R^N$ | $D_G^N$ | $D_B^N$ | $D_R^{CN}$ | $D_G^{MN}$ | $D_B^{YN}$ |
| red | 1.20 | 0.26 | 0.16 | 1.20 | 0.09 | 0.11 |
| green | 0.35 | 1.60 | 0.30 | 0.35 | 1.55 | 0.07 |
| blue | 0.09 | 0.76 | 1.53 | 0.09 | 0.68 | 1.43 |

In step 5, the selective exposures ($E_R$, $E_G$, $E_B$) of the master material, that will produce the analytical master filter densities ($D_R^{CN}$,$D_G^{MN}$,$D_B^{YN}$), found in step 4, are derived from the response curves of the master material to red, green and blue exposure light through a neutral wedge (see FIGS. 6 to 8). The analytical status A red filter densities $D_R^{CN}$ of the master for the red, green and blue pixels on the print respectively are positioned on the vertical axis of FIG. 6.

The corresponding neutral densities $D_N^R$ of the neutral wedge, modulating the red exposing light on the master material can be found on the horizontal axis. These neutral densities, combined with the exposure conditions, mentioned earlier in conjunction of FIG. 6, define the exposures $E_R$ to be given to the master material through the black and white mask, after correct positioning of the latter, in order to obtain the calculated amounts of cyan in the areas on the master, corresponding with the red, green and blue pixels on the print respectively.

In the same way the exposures $E_G$ and $E_B$, needed to obtain the computed magenta and yellow dye amounts for the different kinds of pixels are derived from the curves in FIGS. 7 and 8.

The results are summarized in table V.

TABLE V

| | Step 4 Analytical master filter densities | | | Step 5 Density of neutral filter to add to basic exposure of master with R,G,B light | | |
|---|---|---|---|---|---|---|
| | | | | $D_N^R$ | $D_N^G$ | $D_N^B$ |
| pixel color | $D_R^{CN}$ | $D_G^{MN}$ | $D_B^{YN}$ | (1) | (2) | (3) |
| red | 1.20 | 0.09 | 0.11 | 0.36 | 1.24 | 1.26 |
| green | 0.35 | 1.55 | 0.07 | 1.03 | 0.18 | 1.36 |
| blue | 0.09 | 0.68 | 1.43 | 1.39 | 0.68 | 0.41 |

(1) Basic red exposure is: halogen lamp 150 W/60 lux L622 2" exposure time (see FIG. 6)
(2) Basic green exposure is: halogen lamp 150 W/60 lux U535 2" exposure time (see FIG. 7)
(3) Basic blue exposure is: halogen lamp 150 W/60 lux U449 neutral filter density = 1.0 1" exposure time (see FIG. 8)

In the 6th step, the density values ($D_N^R$,$D_N^G$,$D_N^B$). obtained in step 5, are converted in exposure settings ($E_R$, $E_G$,$E_B$). To illustrate how this can be done, let us take the red exposure $E_R$ of the master material in areas corresponding to the red pixels on the print as an example. According to table V, this exposure $E_R$ equals the basic red exposure+a neutral filter with a density equal to $D_N^R$=0.36.

The additional neutral filter reduces the effect of the basic exposure with a factor equal to 0.44 (=$10^{-0.36}$). This reduction can be realised in several ways:

by effectively introducing in the red exposing light beam a neutral filter with D=0.36;

by reducing the exposure time from 2" to 2"×0.44=0.88", without the addition of a neutral filter. A possible deviation from the reciprocity law should be taken into account;

by inserting a diaphragm that reduces the light output to 0.44 times its value; or, by a combination of two or three of the above described means.

If, for instance, a set of fixed value neutral filters is available, like e.g. D 0.1, D 0.3, D 1.0 and D 2.0, one can insert the D 0.3 filter and compensate for the remaining 0.06 density values (0.36–0.30) by reducing the exposure with a factor 0.87 (=$10^{-0.06}$) from 2" to 1.74".

It is clear that the implementation of step 6 depends on the practical means available in the apparatus used to expose the master material.

If one does not take into account the effect of the unwanted absorptions of the master dyes, and if one omits corrective step 4, then red, green and blue pixels are obtained on the print that deviate strongly from the desired ones. Those deviations can be easily calculated.

Let us consider the integral densities of the master ($D_R^N$, $D_G^N$,$D_B^N$) in step 3 of tables III and IV.

Omitting step 4 means that one defines exposures ($E'_R$, $E'_G$,$E'_B$) of the master material, that will generate in the individual layers of the master dye amounts corresponding to the integral densities of step 3. The integral effect of those dye amounts can be calculated by means of the matrix (not the inverse matrix !) preceding table IV (see equation 10).

In table VI the results of those calculations are reproduced.

TABLE VI

| | Integral master densities in step 3 | | | Calculated effective integral densities | | |
|---|---|---|---|---|---|---|
| Pixel color | $D_R^N$ | $D_G^N$ | $D_B^N$ | $D'_R{}^N$ | $D'_G{}^N$ | $D'_B{}^N$ |
| red | 1.20 | 0.26 | 0.16 | 1.20 | 0.43 | 0.23 |
| green | 0.35 | 1.60 | 0.30 | 0.35 | 1.66 | 0.54 |
| blue | 0.09 | 0.76 | 1.53 | 0.09 | 0.84 | 1.64 |

From the curves in FIGS. 2, 3 and 4 one can deduce the amounts of cyan, magenta and yellow dyes, expressed as analytical status A densities ($D'_R{}^{CP}$,$D'_G{}^{MP}$,$D'_B{}^{YP}$), that will be generated on the print by printing the uncorrected master on it.

Table VII gives the densities of the print as they should be (aim values, see table III) and the densities as they will be if no correction is applied.

TABLE VII

| | Analytical Status A densities on the print | | | | | |
|---|---|---|---|---|---|---|
| | aim values | | | if no correction is applied | | |
| pixel | $D_R^{CP}$ | $D_G^{MP}$ | $D_B^{YP}$ | $D'_R{}^{CP}$ | $D'_G{}^{MP}$ | $D'_B{}^{YP}$ |
| red | 0.00 | 1.54 | 1.60 | 0.00 | 1.23 | 1.50 |
| green | 1.01 | 0.00 | 1.38 | 1.01 | 0.00 | 0.95 |
| blue | 1.80 | 0.59 | 0.03 | 1.80 | 0.46 | 0.01 |

Table VIII shows the color differences between both sets of status A densities in the print, expressed as $\Delta E^*_{UV}$.

TABLE VIII

| | aim values | | | values without correction | | | |
|---|---|---|---|---|---|---|---|
| | L* | U* | V* | L'* | U'* | V'* | $\Delta E^*_{UV}$ |
| red | 45.5 | 127.7 | 21.2 | 50.44 | 121.9 | 24.8 | 8.4 |
| green | 70.32 | −66.8 | 68.4 | 71.64 | −67.1 | 56.6 | 11.8 |
| blue | 38.7 | −26.2 | −99.8 | 43.3 | −30.4 | −100.9 | 6.3 |

From table VIII it is clear that neglecting the photographic effect of the secondary absorption of the master dyes results in serious deviations from the aim values.

The method of our invention allows an accurate specification of the exposures to be given to the master material in order to obtain well-specified red, green and blue primaries in a fast and easy way, without having to recourse to a negative material provided with colored coupler.

It is, with this method, even possible to use the same photographic material for making the negative master and the positive print.

Having described in detail preferred embodiments of the current invention, it will now be apparent to those skilled in the art that numerous modifications can be made therein without departing from the scope of the invention as defined in the following claims. The print material is not restricted to negative-working photographic material. It may be also positive working. It may have less or more than three dyes that are formed by exposure and color developing The master need not be made from a color negative photographic material. A master may be made by any other process, including thermography, thermosublimation, etc. The master may modulate the light by reflection or transmission. The master may be manufactured by successive exposure and chemical development steps. Preferred embodiments for a method to manufacture the print and master may be found in the dependent claims.

I claim:

1. A process for manufacturing a color print containing at least one monochrome region having a plurality of preset print filter densities, said process comprising the following steps:

(A) providing as a print material a multi-layer color photographic silver halide material;

(B) characterizing said print material for subsequent exposure to a selected printing light;

(C) preparing a master having an amount of at least one master dye at a location on said master corresponding to at least one of said monochrome regions of said color print, said amount being selected according to said characterization step (B) to provide on said color print at least one of said plurality of preset filter densities when said print material is exposed using said printing light;

(D) exposing said print material to said selected printing light modulated by said master of step (C), to obtain an exposed print material; and (E) color developing said exposed print material, to obtain said color print, wherein the step of characterizing said print material comprises:

(i) establishing a relation between a main master filter density of a master, other than said master to be prepared according to step (C), colored with said master dye, and a print filter density of a color print manufactured according to steps (D) and (E), said printing light being modulated by said master colored with said master dye; and (ii) computing, according to said relation, from at least one said preset print filter density, at least one integral master density for said master dye, from which said amount of master dye for said master to be prepared according to step (C) is selected.

2. Process according to claim 1, further comprising the steps of:

(i) after establishing said first relation establishing a second relation between a second main master filter density of a second master, other tan said master to be prepared according to step (C), colored with a second master dye different from said first master dye, and a print filter density of a print manufactured according to steps (D) and (E), said printing light being modulated by said second master colored with said second master dye; thereafter (ii) computing, from at least one said preset print filter density, a second integral master density for said second master dye;

(iii) computing, according to said second relation, from said second integral master density a secondary print density;

(iv) computing, according to said first relation, from said secondary print density, a secondary master density, relating to an equivalent first master dye simulating said second integral master density; and (v) discounting said first integral master density according to said secondary master density, from which said amount of second master dye for said master of step (C) is selected.

3. Process according to claim 1, wherein preparing said master having said amount of said master dye comprises the steps of:

(i) providing as a master material a multi-layer color photographic silver halide material;

(ii) applying at least one spectrally set exposure to said master material to obtain an exposed master material; and (iii) color developing said exposed master material to generate said amount of master dye on said master material.

4. Process according to claim 3, wherein each exposure is computed as a function of an analytical master filter density obtained by discounting an integral master density according to one or more secondary master densities.

5. Process according to claim 3, wherein the step of applying a spectrally set exposure comprises following steps:

(a) establishing an exposure relation between a neutral density of a neutral grey wedge and a corresponding master filter density of a master, obtained by modulating a standard exposure by said neutral grey wedges;

(b) computing, according to said exposure relation, from a required master filter density, a required neutral density of said neutral grey wedge; and (c) computing said exposure as a function of said standard exposure and said required neutral density.

6. Process according to claim 3, wherein said master contains yellow, magenta and cyan master dyes in separate superimposed layers.

7. Process according to claim 3, wherein said amount of said master dye depends on exposure conditions of said spectrally set exposure.

8. Process according to claim 7, wherein said exposure conditions are realized by at least one exposure light beam and characterized by:

the spectral composition of said exposure light beam;

the intensity of said exposure light beam; and the duration of each exposure light beam.

9. Process according to claim 3, wherein each said exposure is applied to said master material through a black and white mask.

10. Process according to claim 3, wherein each said exposure is applied to the master material by varying with respect to the basic exposing conditions:

the intensity of the exposing light beam; or the duration of the exposing light beam;

or both said intensity and duration.

11. Process according to claim 1, wherein said color print is a multi-color filter array element, suitable for a flat panel display.

12. Process according to claim 11, wherein said multi-color filter array element comprises red; green and blue patches in a given order.

13. Process according to claim 12, wherein said color patches are separated by a black contour line pattern.

14. Process according to claim 1, wherein the step of selecting said amount of master dye for said master to provide said print with a preset print filter density comprises the following steps:

(i) specifying colorimetric characteristics of said monochrome region; and (ii) specifying illumination characteristics of said color print.

15. Process according to claim 14, wherein said illumination characteristics comprise any combination of:

the spectral power distribution of a light-source used for back-lighting said color print;

the spectral transmittance of glass panels enclosing said color print;

the spectral transmittance of front and rear polarizers with respect to said color print;

the spectral transmittance of at least one transparent electrode layer placed parallel to said color print; or the spectral transmittance of liquid crystal material, modulating light through said color print.

16. Process according to claim 1, wherein said color print contains yellow, magenta and cyan print dyes in separate superimposed layers.

17. Process according to claim 16, wherein amounts of said print dyes match specified red, green and blue primaries.

18. Process according to claim 1, wherein said printing light comprises at least one printing light beam, each printing light beam being characterized by:

the spectral composition of said printing light beam;

the intensity of said printing light beam; and the duration of said printing light beam.

* * * * *

UNITED STATES PATENT AND TRADEMARK OFFICE
CERTIFICATE OF CORRECTION

PATENT NO. : 5,948,575
DATED : September 7, 1999
INVENTOR(S) : Raymond Roosen

It is certified that error appears in the above-identified patent and that said Letters Patent is hereby corrected as shown below:

Title page,
Item [56], References Cited, U.S. PATENT DOCUMENTS, insert
-- 3,679,414 7/1972 Mukherjee --;
Item [56], References Cited, FOREIGN PATENT DOCUMENTS, insert
-- FOREIGN PATENT DOCUMENTS
0653686A1 10/1994 European Pat. Off. --;
Item [57], ABSTRACT,
Line 5, "calorimetric" should read -- colorimetric --;
Item 75, Inventors: "Gravenwezel" should read -- 's Gravenwezel --;

Column 3,
Line 15, "calorimetric" should read -- colorimetric --;

Column 5,
Line 6, "calorimetric" should read -- colorimetric --;

Column 11,
Line 32, "$P_R^T$In" should read -- $P_R^T$. In --;
Line 43, "calorimetric" should read -- colorimetric --;
Line 48, "calorimetrically" should read -- colorimetrically --;

Column 12,
Line 50, "U535:" should read -- U535; --;

Column 13,
Line 12, "DBYN" should read -- $D_B^{YN}$ --;

Column 15,
Line 55, "calori-" should read -- colori- --;

Column 18,
Line 57, "calori-" should read -- colori- --;

Column 24,
Line 41, "relation" should read -- relation, --;
Line 43, "tan" should read -- than --;

Column 25,
Line 19, "wedges;" should read -- wedge, --;

UNITED STATES PATENT AND TRADEMARK OFFICE

CERTIFICATE OF CORRECTION

PATENT NO. : 5,948,575
DATED : September 7, 1999
INVENTOR(S) : Raymond Roosen

It is certified that error appears in the above-identified patent and that said Letters Patent is hereby corrected as shown below:

Column 26,
Line 6, "red;" should read --red, --;
Line 21, "light-source" should read -- light source --.

Signed and Sealed this

Twenty-fifth Day of December, 2001

*Attest:*

JAMES E. ROGAN

*Attesting Officer*

*Director of the United States Patent and Trademark Office*